(12) United States Patent
Okuda et al.

(10) Patent No.: US 10,383,268 B2
(45) Date of Patent: Aug. 13, 2019

(54) ELECTRONIC COMPONENT INSTALLING DEVICE AND CARTRIDGE FOR ELECTRONIC COMPONENT INSTALLING DEVICE

(71) Applicant: Panasonic Intellectual Property Management Co., Ltd., Osaka (JP)

(72) Inventors: Osamu Okuda, Fukuoka (JP); Kazunobu Sakai, Yamanashi (JP); Eyri Watari, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/759,041

(22) PCT Filed: Aug. 22, 2017

(86) PCT No.: PCT/JP2017/029842
§ 371 (c)(1),
(2) Date: Mar. 9, 2018

(87) PCT Pub. No.: WO2018/051737
PCT Pub. Date: Mar. 22, 2018

(65) Prior Publication Data
US 2019/0045681 A1 Feb. 7, 2019

(30) Foreign Application Priority Data

Sep. 14, 2016 (JP) .................................. 2016-179067
Sep. 14, 2016 (JP) .................................. 2016-179068

(51) Int. Cl.
*H05K 13/04* (2006.01)
(52) U.S. Cl.
CPC ....... *H05K 13/0409* (2018.08); *H05K 13/041* (2018.08)

(58) Field of Classification Search
CPC .................. H05K 13/0409; H05K 13/041
(Continued)

(56) References Cited

U.S. PATENT DOCUMENTS 5,588,195 A * 12/1996 Asai .................. H05K 13/0413
                                                29/33 M
6,210,458 B1  4/2001  Shindo et al.
(Continued)

FOREIGN PATENT DOCUMENTS

JP     63-090419 U     6/1988
JP     H07-024426 U    5/1995
(Continued)

OTHER PUBLICATIONS

International Search Report of PCT application No. PCT/JP2017/029842 dated Nov. 14, 2017.
(Continued)

*Primary Examiner* — Paul T Chin
(74) *Attorney, Agent, or Firm* — Pearne & Gordon LLP

(57) ABSTRACT

A nozzle holder is configured to include an insertion hole for inserting and storing a cartridge from an entrance thereof, a tubular holder tube portion having a vent hole for introducing a negative pressure into the insertion hole, and a clamp lever in which an engaging portion engaged with an engaged portion of the nozzle inserted into the insertion hole in a state where the entrance of the insertion hole is blocked, is formed. Accordingly, when the nozzle is detached from the nozzle holder, the clamp lever prevents the cartridge from coming off the insertion hole by being displaced toward the insertion hole.

6 Claims, 14 Drawing Sheets

(58) Field of Classification Search
USPC .................................................. 294/183, 185
See application file for complete search history.

(56) References Cited

U.S. PATENT DOCUMENTS

| | | | | |
|---|---|---|---|---|
| 6,820,325 | B2* | 11/2004 | Gieskes | H05K 13/0409 |
| | | | | 29/743 |
| 7,261,350 | B2* | 8/2007 | Isetani | B25J 15/0616 |
| | | | | 294/185 |
| 8,997,592 | B2* | 4/2015 | Yang | H05K 13/0478 |
| | | | | 74/55 |
| 9,832,919 | B2* | 11/2017 | Kawaguchi | H05K 13/0408 |
| 9,894,819 | B2* | 2/2018 | Teshima | H05K 13/0408 |
| 10,143,120 | B2* | 11/2018 | Fukami | H05K 13/0408 |
| 2011/0098840 | A1* | 4/2011 | Inaba | H05K 13/0452 |
| | | | | 700/114 |
| 2018/0235118 | A1* | 8/2018 | Okuda | H05K 13/041 |

FOREIGN PATENT DOCUMENTS

| | | |
|---|---|---|
| JP | H11-188218 A | 7/1999 |
| JP | 2005-144438 A | 6/2005 |
| JP | 2008-034410 A | 2/2008 |
| JP | 2012-143861 A | 8/2012 |

OTHER PUBLICATIONS

English Translation of the International Search Report Issued in Patent Application No. PCT/JP2017/029842 dated Nov. 14, 2017.

\* cited by examiner

ELECTRONIC COMPONENT INSTALLING DEVICE AND CARTRIDGE FOR ELECTRONIC COMPONENT INSTALLING DEVICE

TECHNICAL FIELD

The present disclosure relates to an electronic component installing device which holds and installs an electronic component on a board by applying a negative pressure to a suction hole of a nozzle, and a cartridge for an electronic component installing device.

BACKGROUND ART

In a component mounting field where a mounting board is produced by installing an electronic component on a board, a method of suctioning and holding the electronic component under a negative pressure by a nozzle provided in an installing head of an electronic component installing device is widely used. In this type of electronic component installing device, a configuration in which the nozzle can be installed to be freely replaceable in a nozzle holder provided in a nozzle shaft provided in the installing head, is employed, and accordingly, it is possible to attach and detach the nozzle for changing the type of the nozzle that corresponds to the shape or the size of the electronic component that serves as a work target, or for the maintenance. In addition, filters for filtering foreign substances in the suctioned air are incorporated in the nozzles (for example, refer to Patent Literatures 1 and 2).

In the technology of the related art in Patent Literature 1, an example in which a lower end of a head main body portion is a nozzle holder, and a filter for filtering the air suctioned from the nozzle is freely attachably and detachably installed in a filter holder formed at a position at which a vent port of the head main body portion opens at the lower end, is described. In addition, in the technology of the related art in Patent Literature 2, a configuration in which a filter is stored on the inside of a nozzle main body portion (flange) provided with a storage unit in which a suction shaft portion (one end portion) protrudes and is stored, in a vacuum suction nozzle installed on a nozzle holder, is described.

CITATION LIST

Patent Literature

PTL 1: Japanese Patent Unexamined Publication No. 2008-34410
PTL 2: Japanese Patent Unexamined Publication No. 2012-143861

SUMMARY OF THE INVENTION

An electronic component installing device according to the present disclosure includes: a nozzle which holds an electronic component by applying a negative pressure to a suction hole that is open in a tip end portion of the nozzle; a main shaft which includes a nozzle holder that detachably holds the nozzle in a lower end portion of the main shaft; and a cartridge which includes a filter for filtering air suctioned from the nozzle. The nozzle holder includes an insertion hole having an entrance from which the cartridge is inserted to be accommodated in the insertion hole, a tubular holder tube portion having a vent hole for introducing a negative pressure into the insertion hole, and a clamp lever in which an engaging portion engaged with an engaged portion of the nozzle inserted into the insertion hole in a state where the entrance of the insertion hole is blocked, is formed. When the nozzle is detached from the nozzle holder, the clamp lever prevents the cartridge from coming off the insertion hole by being displaced toward the insertion hole.

A cartridge for an electronic component installing device according to the present disclosure which is used in an electronic component installing device including: (i) a nozzle which has a tip end portion and an installed portion, the nozzle is provided with a first suction path which penetrates from the tip end portion to the installed portion, and the nozzle holds an electronic component in the tip end portion under a negative pressure introduced to the first suction path; and (ii) a nozzle holder which inserts the installed portion into an insertion hole provided to communicate with a second suction path connected to a negative pressure generation source, the nozzle holder detachably holding the nozzle, the cartridge being installed on the nozzle holder in a state of being inserted into the insertion hole, the cartridge includes: a filter holding body which has an external dimension that is insertable into the insertion hole, and has an inner space that penetrates from one end portion to the other end portion of the filter holding body; a filter which is disposed in the inner space, and filters air suctioned through the first suction path; an annular packing which is disposed in the one end portion of the filter holding body, and abuts against a stopper provided in a far portion of the insertion hole so as to airtightly connect the second suction path and the inner space to each other; and a pad which is disposed in the other end portion of the filter holding body, and is made of an elastic member which abuts against the installed portion inserted into the insertion hole so as to airtightly connect the first suction path and the inner space to each other.

According to the present disclosure, in a configuration in which the cartridge which holds the nozzle for holding the electronic component under a negative pressure to be freely attachable and detachable in the nozzle holder, and which includes the filter for filtering the air suctioned from the nozzle, is provided, it is possible to reduce the size of the nozzle holder, and to easily store and pick up the cartridge to and from the nozzle holder.

According to the present disclosure, in a configuration in which the cartridge including the filter for filtering the air suctioned from the nozzle, is provided, it is possible to reduce the size of the nozzle holder, to improve the filtration performance of the filter, and to improve the workability at the time of attachment and detachment.

DESCRIPTION OF EMBODIMENTS

Prior to describing the embodiments, problems in the related art will be briefly described.

The related art illustrated in the above-described patent documents has the following problems due to the installation structure of a filter for filtering foreign substances. First, in the related art, since a configuration in which the filter is installed on the inside of a nozzle is employed, it is difficult to avoid restrictions on the shape and the size of the filter, and it is necessary to adopt a structure in which a filter having a small size is installed at a narrow part. As a result, there was a problem that a difficulty related to the filtration performance that a service life is shortened since it is not possible to ensure a sufficient filtration surface in the filter, and the workability at the time of attachment and detachment for maintenance or replacement is not excellent. In addition, in the component installing field, the miniaturization of electronic components has progressed, and accordingly, it has been required to further reduce the diameter and the size of the nozzle for holding the electronic components or the nozzle holder for holding the nozzle, compared to the related art. However, in the examples of the above-described patent documents, a configuration for realizing such a request is not disclosed in the technology of the related art, and a new strategy has been demanded.

An object of the present disclosure is to provide in an electronic component installing device and a cartridge for an electronic component installing device which can reduce the size of a nozzle holder and can easily store and pick up the cartridge to and from the nozzle holder in a configuration in which the cartridge which holds a nozzle for holding an electronic component under a negative pressure to be freely attachable and detachable in a nozzle holder, and which includes a filter for filtering the air suctioned from the nozzle, is provided.

Next, embodiments of the present disclosure will be described with reference to the drawings. First, a structure of electronic component installing device 1 will be described with reference to FIG. 1. Hereinafter, a transport direction of a board is defined as an X direction, a direction orthogonal to the X direction and a horizontal plane is defined as a Y direction, a direction orthogonal to an XY plane is defined as a Z direction, and a direction in the horizontal plane that rotates around the Z direction is defined as θ direction. A positive direction of a Z axis is an upper part and an upward direction, and a negative direction of the Z axis is a lower part and a downward direction. In each member, an end portion positioned in the positive direction of the Z axis is defined as an upper end, and an end portion positioned in the negative direction of the Z axis is defined as a lower end.

Figure 1:
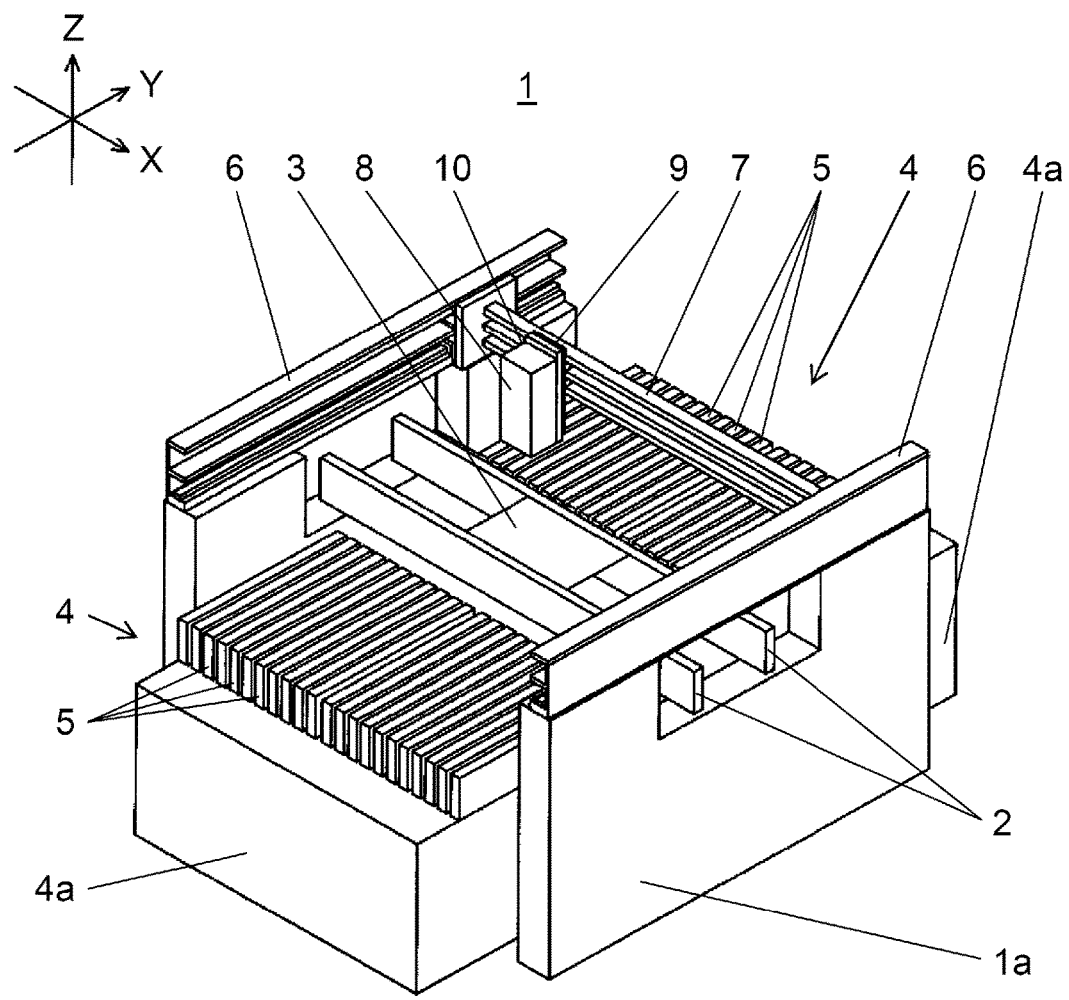
FIG. 1 is a perspective view illustrating the overall configuration of an electronic component installing device according to an embodiment of the present disclosure.

Electronic component installing device 1 has a function of applying a negative pressure to a suction hole of a nozzle, holding an electronic component by vacuum-sucking the electronic component, and installing the electronic component on a board. In FIG. 1, board transport mechanism 2 including one pair of transport conveyors which extends in the X direction is provided at the center portion of base 1*a*. Board transport mechanism 2 receives and transports board 3 which is a component installation target from an upstream side device, and positions and holds the board at an installation working position by a component placing mechanism which will be described hereinafter.

On both sides of board transport mechanism 2, component supplier 4 is provided. Component supplier 4 is configured with a plurality of tape feeders 5 arranged in parallel on feeder table 4*a*. Tape feeder 5 supplies the electronic component which is an installation target to a pickup position by installing head 8 of the component placing mechanism, by pitch feeding a carrier tape which stores the electronic component installed on board 3 therein.

Next, the component placing mechanism will be described. At the end portion of base 1*a* in the X direction, Y-axis beam 6 having a linear driving mechanism is provided, and X-axis beam 7 having a linear driving mechanism is installed to be freely movable in the Y direction in Y-axis beam 6. Plate member 9 is installed to be freely movable in the X direction on X-axis beam 7, and installing head 8 is installed on plate member 9 via holding frame 10.

Figure 2:
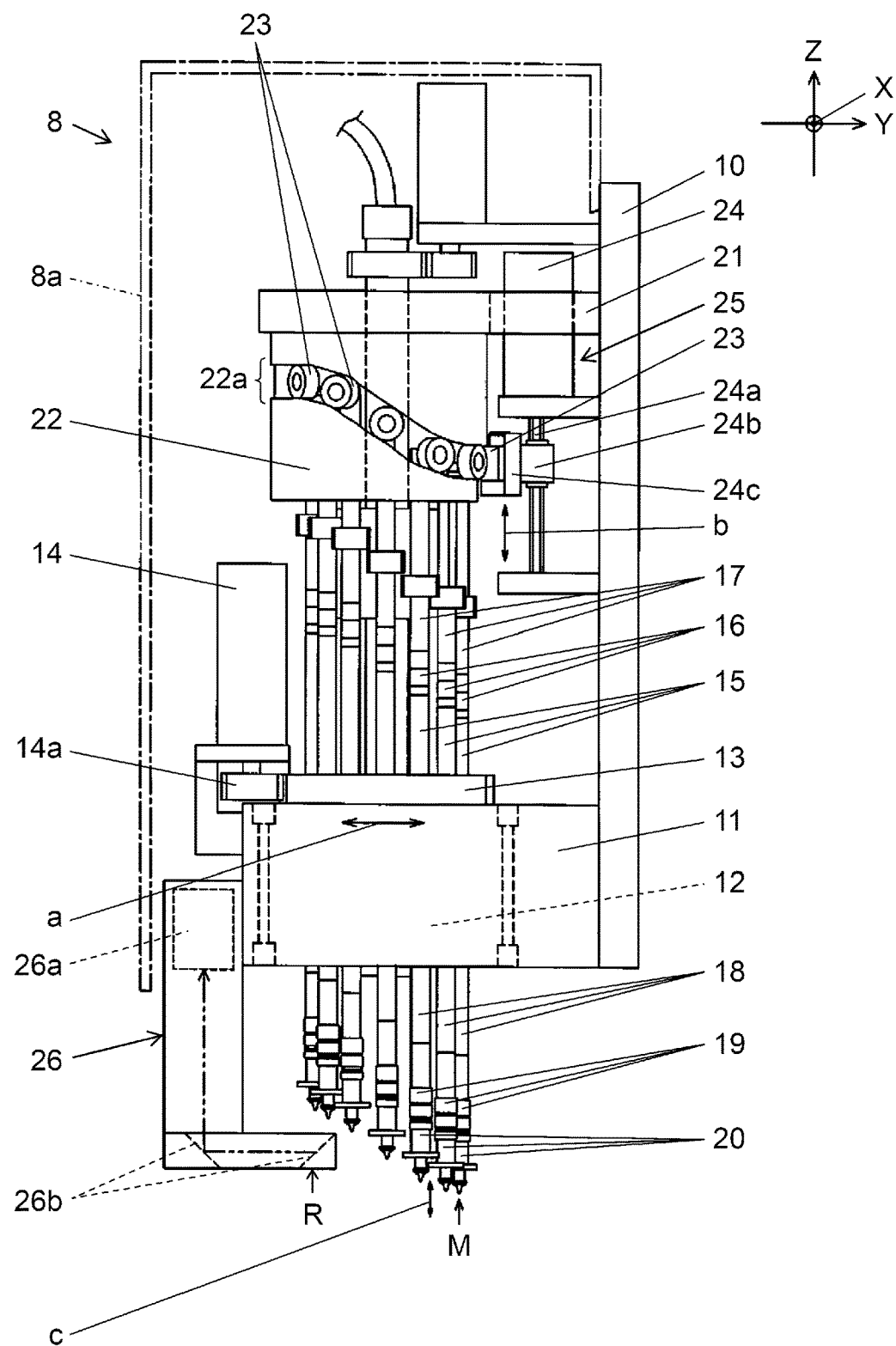
FIG. 2 is a configuration explanatory view of an installing head used in the electronic component installing device according to the embodiment of the present disclosure.
Figure 4:
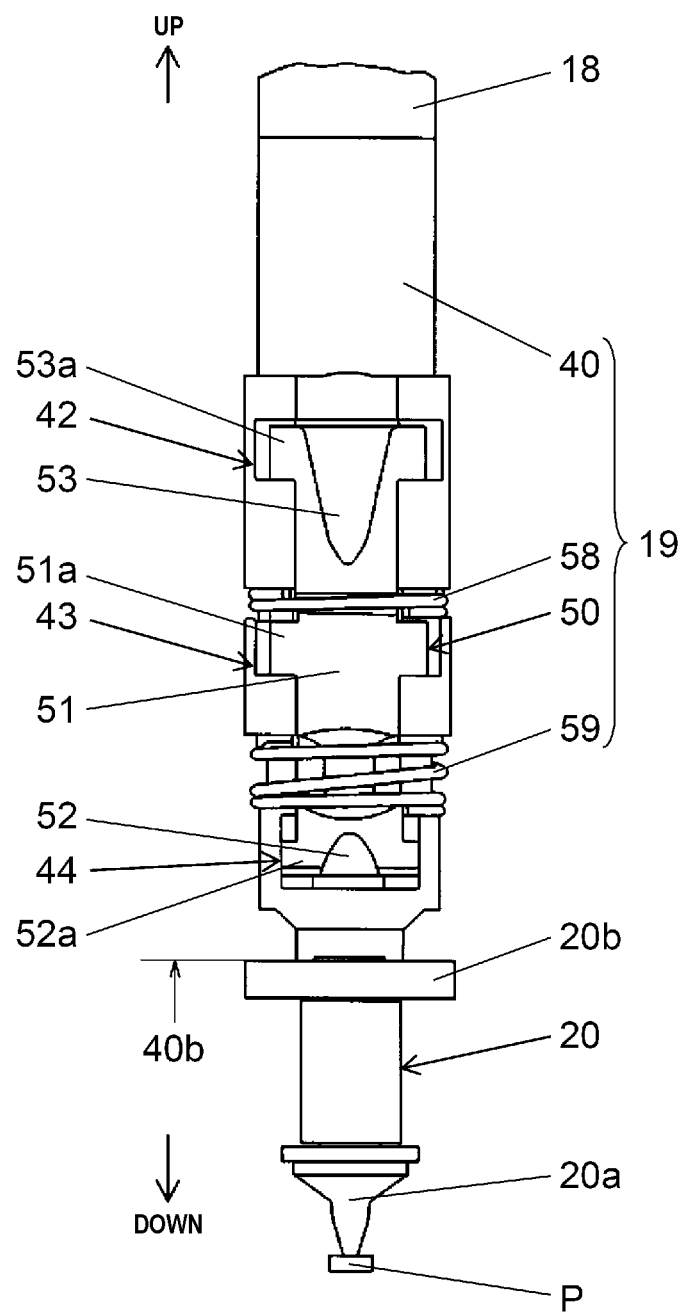
FIG. 4 is a front view of a nozzle holder in a main shaft used in the electronic component installing device according to the embodiment of the present disclosure.

Installing head 8 has a function of picking up and holding electronic component P (refer to FIG. 4) installed on board 3 from component supplier 4 by nozzle 20 (refer to FIGS. 2 and 4). As the nozzle 20, a suction nozzle which holds electronic component P by applying a negative pressure generated under a negative pressure generation source to a suction hole that is open in a tip end portion, is used. Installing head 8 horizontally moves in the X direction and in the Y direction by driving Y-axis beam 6 and X-axis beam 7, and electronic component P held by nozzle 20 is installed on board 3 positioned and held by board transport mechanism 2.

Next, with reference to FIGS. 2 and 3, a structure of installing head 8 will be described. In FIG. 2, installing head 8 has a structure in which a side surface and an upper surface are covered by holding frame 10 and cover 8*a* fixed to holding frame 10. Rotor holding unit 11 is provided to extend in the horizontal direction in a lower portion of holding frame 10. In rotor holding unit 11, columnar main shaft holding unit 12 that serves as a rotor is freely rotatably held around rotation axis CL in the Z direction via bearing 11a (refer to FIG. 3).

In main shaft holding unit 12, a plurality of main shafts 15 are held in a state of being raisable and lowerable by raising and lowering mechanism 25 in a concentric disposition around rotation axis CL. The main shaft 15 includes nozzle holder 19 for holding nozzle 20 to be freely attachable and detachable in the lower end portion thereof. In the present embodiment, main shaft 15 is divided into first shaft 17 (an upper portion of the main shaft) and second shaft 18 (a lower portion of the main shaft) that are linked to raising and lowering mechanism 25 that raises and lowers main shaft holding unit 12. Second shaft 18 is configured to include nozzle holder 19 and a part held by main shaft holding unit 12. First shaft 17 and second shaft 18 are linked to each other via shaft linking unit 16 provided in the lower end portion of first shaft 17 (refer to FIGS. 11 and 12).

Holding body driven gear 13 around rotation axis CL is fixed to the upper surface of main shaft holding unit 12, and index driving motor 14 is disposed above rotor holding unit 11. Index driving gear 14a which meshes with holding body driven gear 13 is installed on index driving motor 14. By driving index driving motor 14, holding body driven gear 13 is driven via index driving gear 14a, and accordingly, main shaft holding unit 12 index-rotates together with holding body driven gear 13 (arrow a).

In FIG. 2, in the upper portion of holding frame 10, cam holding unit 21 for fixing cylindrical cam 22 is provided to extend in the horizontal direction. Guide groove 22a is provided on an outer circumferential surface of cylindrical cam 22. Guide groove 22a is provided so as to be higher on a side opposite to holding frame 10 and to gradually decrease as approaching holding frame 10. Cam follower 23 attached to first shaft 17 of each main shaft 15 is installed on cylindrical cam 22 so as to be movable along guide groove 22a. When main shaft holding unit 12 index-rotates, main shaft 15 vertically moves along guide groove 22a of cylindrical cam 22 while circulating in the horizontal direction following the index rotation. A part of cylindrical cam 22 is cut off at a location where guide groove 22a is the lowest, and guide groove 22a is interrupted at a cut-off location.

Between holding frame 10 and cylindrical cam 22, raising and lowering mechanism 25 is disposed. Raising and lowering mechanism 25 includes screw shaft 24a which extends in the Z direction, raising and lowering motor 24 which rotationally drives screw shaft 24a, and nut 24b which is screwed to screw shaft 24a. Nut 24b is provided with cam follower holder 24c which is movable to be raised and lowered along the cut-off location of cylindrical cam 22. Cam follower holder 24c is raised and lowered together with nut 24b by driving raising and lowering motor 24. Cam follower holder 24c has a shape which complements guide groove 22a cut off at the cut-off location.

Cam follower 23 which has moved along guide groove 22a is disengaged from guide groove 22a at this position and is held after being transferred to cam follower holder 24c which stands by at the same height position as guide groove 22a. When raising and lowering motor 24 is driven in this state, cam follower holder 24c and cam follower 23 are raised and lowered together with cam follower 23 (arrow b). As illustrated in FIG. 3, substantially L-shaped joint portion 17a is installed on the upper end portion of first shaft 17 to be freely rotatable in the θ direction, and cam follower 23 is attached to joint portion 17a while a rotation axis around the horizontal direction is oriented outward. With this configuration, when cam follower 23 is raised and lowered, first shaft 17 coupled thereto via joint portion 17a is raised and lowered, and accordingly, nozzle 20 held by nozzle holder 19 of the lower end portion of second shaft 18 linked to first shaft 17 via shaft linking unit 16 is raised and lowered (arrow c).

In other words, the position of main shaft 15 which holds cam follower 23 by cam follower holder 24c is determined as rising and lowering position M at which main shaft 15 is raised and lowered in order to suction and pick up electronic component P by nozzle 20 or to install held electronic component P on board 3. In rotor holding section 11, component recognition unit 26 for imaging electronic component P held by nozzle 20 from below, is provided. Component recognition unit 26 has a function of imaging a state of electronic component P held by nozzle 20 from below at a timing when nozzle 20 in the lower end portion of main shaft 15 held by main shaft holding unit 12 is positioned at component recognition position R by the index rotation of main shaft holding unit 12.

In other words, component recognition unit 26 includes mirrors 26b which are respectively provided below component recognition position R and below camera 26a. By guiding imaging light of electronic component P held by nozzle 20 positioned at component recognition position R to camera 26a by mirrors 26b, the image of electronic component P held by nozzle 20 is obtained, and by performing recognition processing with respect to the obtained images, identification of electronic component P and a positional shift state are recognized. When placing electronic component P on board 3, correction of the installation position of the position of main shaft 15 in installing head 8 in the θ direction and the position in the XY direction by the component placing mechanism is performed, taking into consideration the recognition result of electronic component P by component recognition unit 26.

Next, with reference to FIG. 3, a configuration of a rotational driving system and a suction and exhaust system of main shaft 15 in installing head 8 will be described. In addition, main shaft 15 illustrated in the embodiment has a configuration in which first shaft 17 including cam follower 23, joint portion 17a, nozzle rotation gear 37, and shaft linking unit 16 in the lower end portion thereof, and second shaft 18 including nozzle holder 19 in the lower end portion, are linked to each other via shaft linking unit 16.

Figure 3:
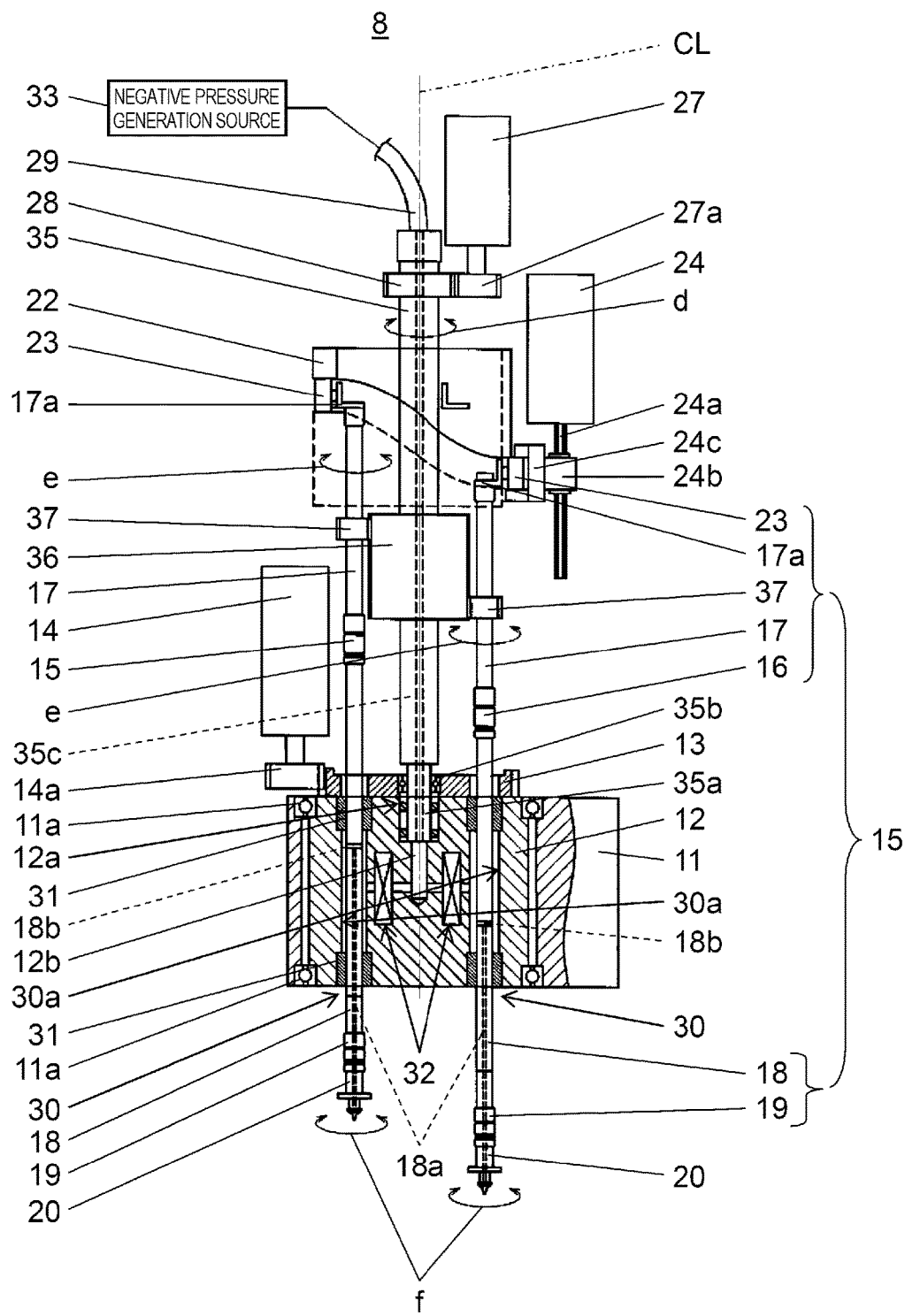
FIG. 3 is a partial sectional view of an installing head used in the electronic component installing device according to the embodiment of the present disclosure.

As illustrated in FIG. 3, second shaft 18 of main shaft 15 is inserted through through-hole 30 provided to vertically penetrate main shaft holding unit 12. An inner diameter of through-hole 30 is set to be greater than an outer diameter of second shaft 18, and in a state where second shaft 18 is inserted through through-hole 30, void portion 30a is formed on the inside of through-hole 30.

Bearing portions 31 are installed on both of the upper and lower end portions of each through-hole 30, and second shaft 18 is slidably and airtightly fitted to bearing portion 31.

Accordingly, in a state where void portion 30a is sealed to the outside, main shaft 15 can be raised and lowered and rotated around the axis.

In FIG. 3, on the upper surface of main shaft holding unit 12, fitting hole 12a around rotation axis CL of main shaft holding unit 12 is provided. Columnar rotating body 35 which vertically penetrates cylindrical cam 22 is freely rotatably provided with respect to main shaft holding unit 12 by inserting rotating body tip end portion 35a into fitting hole 12a via bearing 35b.

In the vicinity of the upper end portion of rotating body 35, a θ rotation driven gear 28 around rotation axis CL is fixed. Above cylindrical cam 22, θ rotation motor 27 on which θ rotation driving gear 27a that meshes with θ rotation driven gear 28 is installed, is disposed. θ rotation driven gear 28 rotates in the θ direction via θ rotation driving gear 27a by the driving of θ rotation motor 27. Accordingly, rotating body 35 rotates in the θ direction together with θ rotation driven gear 28 (arrow d).

Between main shaft holding unit 12 and cylindrical cam 22 in rotating body 35, nozzle driving gear 36 which extends to be long in the vertical direction corresponding to the raising and lowering stroke of main shaft 15 is coupled. Nozzle rotation gear 37 is coupled to each main shaft 15 at a position at which nozzle rotation gear 37 meshes with nozzle driving gear 36. Each main shaft 15 rotates in the θ direction at the same time through nozzle rotation gear 37 by the driving of nozzle driving gear 36 (arrow e).

In this manner, main shaft 15 rotates in the θ direction by the driving of θ rotation motor 27, and accordingly, nozzle 20 held by nozzle holder 19 in the lower end portion of second shaft 18 also rotates in the θ direction (the arrow f).

Next, the suction and exhaust system of installing head 8 will be described. In FIG. 3, on the inside of second shaft 18, shaft inner hole 18a of which the lower end portion leading to nozzle 20 is provided. Shaft inner hole 18a communicates with vent hole 40a provided in nozzle holder 19 and nozzle flow path 20g (refer to FIG. 6) provided in nozzle 20 via filter 62. Above shaft inner hole 18a, there is provided second shaft opening portion 18b which is open to the outer circumferential surface of second shaft 18 at a position between two upper and lower bearing portions 31 and communicates with void portion 30a. Even when main shaft 15 vertically moves, second shaft opening portion 18b is positioned within a range of void portion 30a sandwiched between two upper and lower bearings 31.

On the inside of main shaft holding unit 12, common flow path 12b which is open on the upper surface of fitting hole 12a provided at the upper center of main shaft holding unit 12 is provided in the longitudinal direction along rotation axis CL. Common flow path 12b communicates with rotating body inner hole 35c provided on the inside of rotating body 35 fitted to fitting hole 12a. Rotating body inner hole 35c communicates with negative pressure generation source 33 via pipe 29 connected to the upper end portion of rotating body 35. By actuating negative pressure generation source 33, it is possible to apply a negative pressure by suctioning the inside of common flow path 12b via rotating body inner hole 35c. Therefore, common flow path 12b is a negative pressure side flow path that applies a negative pressure to nozzle 20.

In addition, common flow path 12b communicates with void portion 30a of each through-hole 30 via flow path switching section 32 provided on the inside of main shaft holding unit 12. Flow path switching section 32 has a function of switching a nozzle side flow path that communicates with nozzle 20, that is, a connection point of nozzle flow path 20g of communicating nozzle 20 which communicates with void portion 30a, and further communicates via second shaft opening portion 18b, shaft inner hole 18a, and nozzle holder 19. With the connection point switching function, as the connection point of nozzle 20, any of common flow path 12b which is a negative pressure side flow path for applying a negative pressure to nozzle 20 and a positive pressure side flow path (not illustrated) for applying a positive pressure to nozzle 20, is selected and switched. By performing the flow path switching in this manner, it is possible to select and execute suctioning and holding due to the negative pressure of electronic component P by nozzle 20 and releasing due to the positive pressure of held electronic component P.

Next, with reference to FIGS. 4 to 10, the configuration and the function of nozzle holder 19 provided in the lower end portion of second shaft 18 which configures main shaft 15 will be described. As illustrated in FIG. 4, nozzle holder 19 provided in the lower end portion of second shaft 18 includes holder tube portion 40, clamp lever 50, fulcrum spring 58 for biasing and fixing clamp lever 50 with respect to holder tube portion 40, and clamp spring 59. The lower end of nozzle holder 19 is nozzle receiving portion 40b (also refer to FIGS. 7 and 8) of holder tube portion 40, and in a state where nozzle 20 is installed and held by nozzle holder 19, the upper surface of flange portion 20b of nozzle 20 abuts against nozzle receiving portion 40b. In this state, by applying a negative pressure to nozzle 20, electronic component P is held on the suction surface of tip end portion 20a.

Here, the configuration of nozzle 20 held by nozzle holder 19 will be described with reference to FIG. 6. In nozzle holder 19, nozzle 20 includes tip end portion 20a provided with suction hole 20f for suctioning and holding electronic component P, and installed portion 20c which is a part installed in nozzle holder 19 to be freely attachable and detachable, and flange portion 20b which abuts against nozzle receiving portion 40b during the installation on nozzle holder 19 is provided to extend to a side.

Furthermore, large diameter portion 20d provided in the end portion on the upper side, and engaged portion 20e for engaging portion 57 of clamp lever 50 and fixing nozzle 20, are provided in installed portion 20c. On the inside of nozzle 20, nozzle flow path 20g (first suction path) which penetrates from tip end portion 20a to installed portion 20c is provided leading to suction hole 20f which is open in tip end portion 20a.

In addition, nozzle 20 holds electronic component P in tip end portion 20a by vacuum-sucking under a negative pressure introduced into nozzle flow path 20g. In addition, above installed portion 20c of nozzle holder 19, cartridge 60 including filter holding body 61 which holds filter 62 for filtering the air suctioned from nozzle 20 on the inside, is stored.

Figure 7:
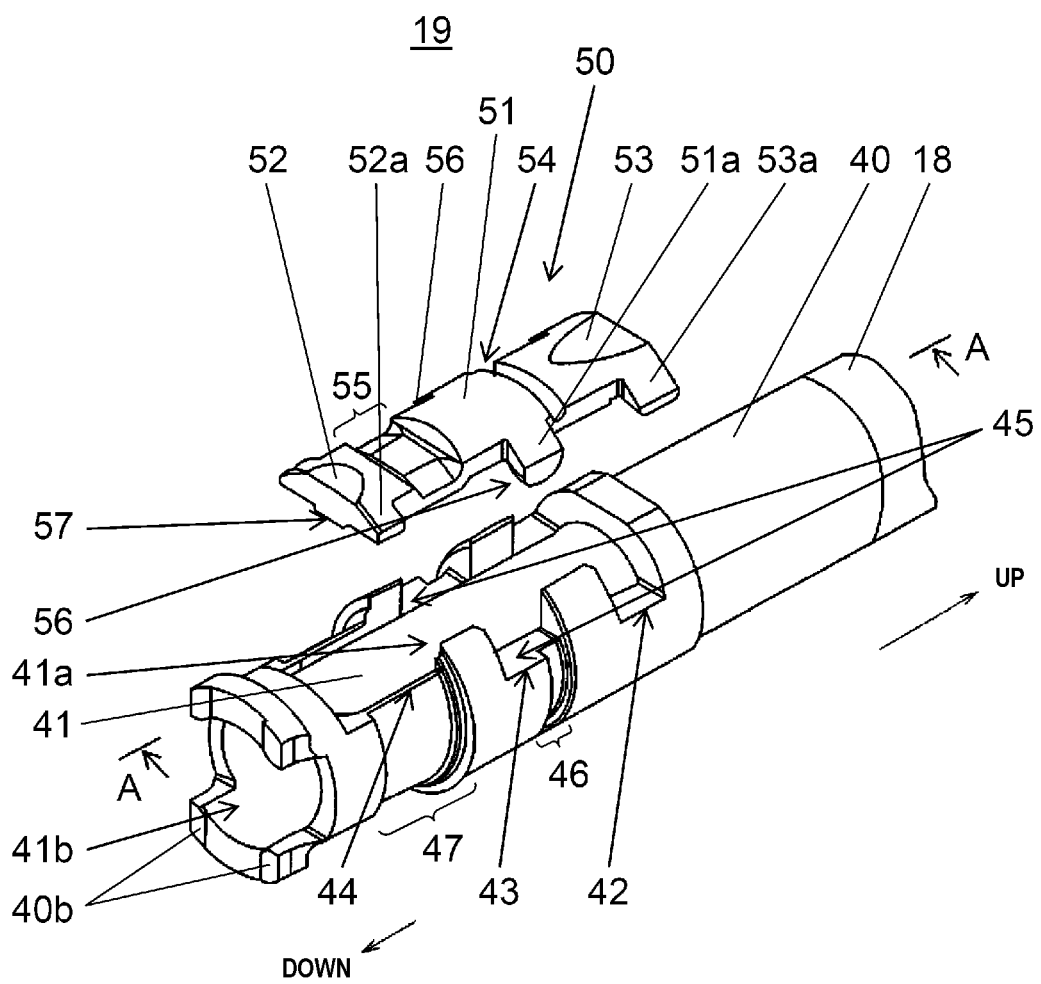
FIG. 7 is a perspective view of the nozzle holder in the main shaft used in the electronic component installing device according to the embodiment of the present disclosure.
Figure 8:
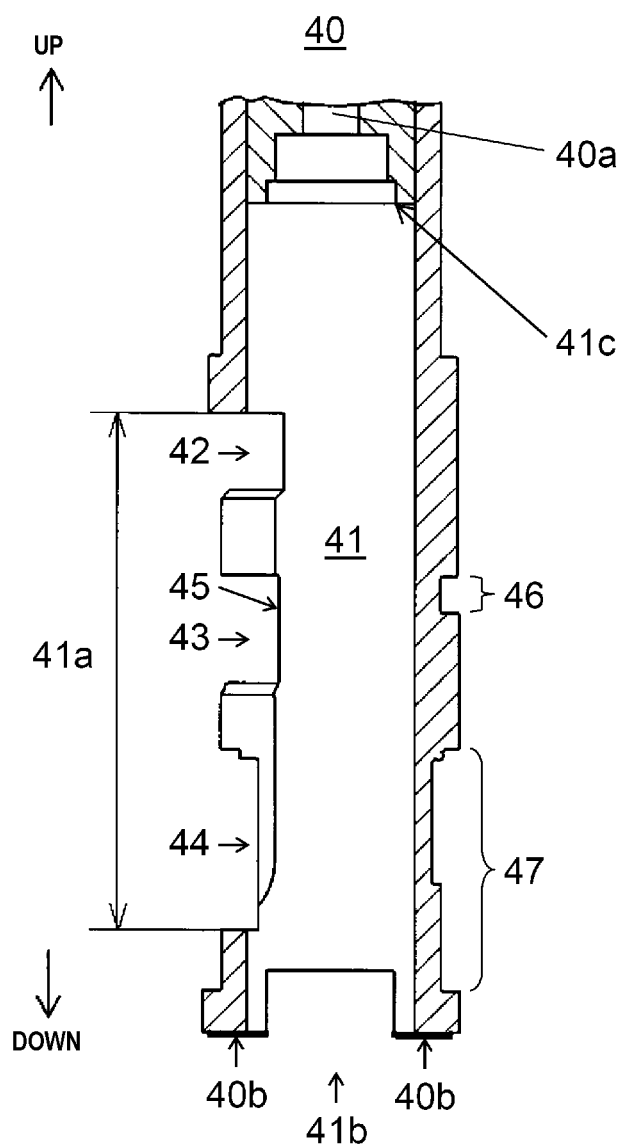
FIG. 8 is a sectional view of a holder tube portion of the nozzle holder in the main shaft used in the electronic component installing device according to the embodiment of the present disclosure.

Next, with reference to FIGS. 7 and 8, the shapes and the functions of holder tube portion 40 and clamp lever 50 will be described. As illustrated in FIG. 7, holder tube portion 40 is a tubular member having insertion hole 41 into which installed portion 20c (refer to FIG. 6) provided in nozzle 20 is inserted. As illustrated in FIGS. 7 and 8 (a section taken along the line A-A in FIG. 7), opening portion 41a leading to insertion hole 41 is formed on one side surface (upper surface in FIG. 7) of insertion hole 41.

On the side surface of the range in which opening portion 41a is formed in holder tube portion 40, three notch portions, such as first notch portion 42, second notch portion 43, and third notch portion 44, are formed from the upper side. The notch portions have a shape in which a tube portion of holder tube portion 40 is partially cut off by a plane parallel to opening portion 41a. Furthermore, at positions where second notch portion 43 and third notch portion 44 are formed, fulcrum spring holding unit 46 and clamp spring holding unit 47 are formed, respectively. One clamp lever 50 having the shape illustrated in FIG. 7 is fitted to opening portion 41a.

Clamp lever 50 has a function of locking installed portion 20c inserted into insertion hole 41 with engaging portion 57 provided in working unit 52 described hereinafter. In other words, in the present embodiment, engaging portion 57 of one clamp lever 50 is engaged with installed portion 20c of nozzle 20 inserted into insertion hole 41 via opening portion 41a. By employing the configuration in which nozzle 20 is locked by single clamp lever 50 in this manner, the reduction of the size of nozzle holder 19 is realized.

The clamp lever 50 has a circumferential surface having a curvature which is substantially similar to that of the outer circumference of the part at which opening portion 41a is formed in holder tube portion 40 on the upper surface, and is a deformed member having a shape of a plane that can be inserted into opening portion 41a, first notch portion 42, second notch portion 43, and third notch portion 44. The detailed shape and function of clamp lever 50 will be described. The center portion of clamp lever 50 is fulcrum portion 51. In fulcrum portion 51, extending portion 51a having a shape that can be fitted to second notch portion 43 is provided to extend to both sides, and abutting fulcrum 56 which abuts against fulcrum support unit 45 on the lower surface of extending portion 51a and becomes the center when clamp lever 50 swings is provided.

A position which extends downward from fulcrum portion 51 is working unit 52. In working unit 52, extending portion 52a having a shape that can be fitted to third notch portion 44 is provided to extend on both sides. In addition, on the lower surface of working unit 52, engaging portion 57 having a shape that is engaged with engaged portion 20e of installed portion 20c inserted into insertion hole 41 is provided (also refer to FIG. 6). Furthermore, a position which extends upward from fulcrum portion 51 is operation unit 53, and extending portion 53a having a shape that can be fitted to first notch portion 42 is provided to extend to both sides in operation unit 53.

In other words, as illustrated in the above-described configuration, clamp lever 50 is configured to include fulcrum portion 51, working unit 52 that extends downward from fulcrum portion 51, and operation unit 53 that extends upward from fulcrum portion 51. In addition, as described above, a configuration in which, three notch portions, such as first notch portion 42, second notch portion 43, and third notch portion 44, are formed on the side surface of holder tube portion 40, and at least a part of clamp lever 50 is disposed on the inner side of the notch portions, is achieved. In this manner, by disposing a part of clamp lever 50 in the notch portion formed in holder tube portion 40, the size of the outer shape of nozzle holder 19 can be reduced.

Figure 5:
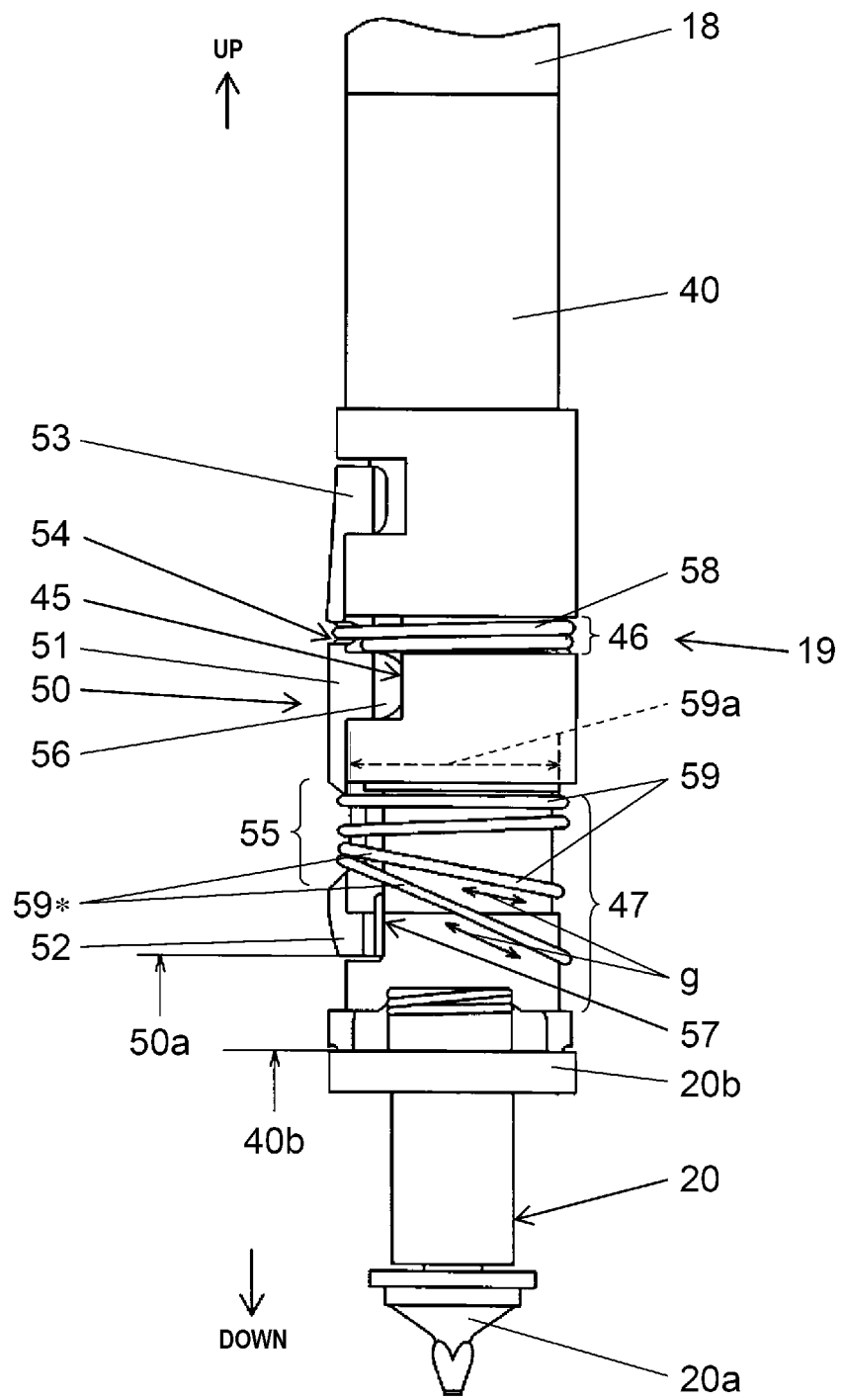
FIG. 5 is a side view of the nozzle holder in the main shaft used in the electronic component installing device according to the embodiment of the present disclosure.

Fulcrum portion side groove 54 having a shape of a narrow groove is provided between fulcrum portion 51 and operation unit 53, and working unit side groove 55 having a shape of a wide groove is provided between working unit 52 and fulcrum portion 51. As illustrated in FIGS. 4 and 5, when installing clamp lever 50 on holder tube portion 40, first, extending portions 53a, 51a, and 52a are fitted to first notch portion 42, second notch portion 43, and third notch portion 44, respectively. At this time, abutting fulcrum 56 provided on the lower surface of extending portion 51a abuts against fulcrum support unit 45 (refer to FIG. 7) which is a notch surface of second notch portion 43. In other words, in holder tube portion 40, fulcrum supporting unit 45 for supporting abutting fulcrum 56 is provided in second notch portion 43. In this manner, by using second notch portion 43 provided in holder tube portion 40 as fulcrum support unit 45 for supporting clamp lever 50, it is possible to reduce the size of the outer shape of nozzle holder 19.

At the outer circumference of fulcrum portion side groove 54 and fulcrum spring holding unit 46, fulcrum spring 58 using a coil spring which is spirally wound to circulate around fulcrum portion side groove 54 and fulcrum spring holding unit 46 is installed. Fulcrum spring 58 is a second elastic member for biasing abutting fulcrum 56 of fulcrum portion 51 of clamp lever 50 to fulcrum support unit 45. Accordingly, clamp lever 50 is held in a state where abutting fulcrum 56 of fulcrum portion 51 abuts against fulcrum support unit 45, and is placed in a state of being swingable around abutting fulcrum 56 by fulcrum support unit 45.

With such a configuration, as clamp lever 50 swings around abutting fulcrum 56 of fulcrum portion 51, the following functions are realized. In other words, a structure in which engaging portion 57 formed in working unit 52 is advanced into insertion hole 41 on the inside of holder tube portion 40 by displacing working unit 52 side toward the inside of holder tube portion 40, is achieved. On the other hand, when operation unit 53 side is displaced toward the inside of holder tube portion 40, working unit 52 opens outward, the locking of installed portion 20c inserted into insertion hole 41 of holder tube portion 40 can be released, and as will be described later, cartridge 60 can go in and out of insertion hole 41 via entrance 41b (refer to FIG. 7) (refer to FIG. 10).

In other words, engaging portion 57 which is engaged with installed portion 20c of nozzle 20 inserted into insertion hole 41 via opening portion 41a in a state where entrance 41b of insertion hole 41 is blocked, is formed in clamp lever 50 having the above-described configuration. Accordingly, an engaging function for being engaged with nozzle 20 and for being fixed and installed on nozzle holder 19, and a coming-off preventing function for preventing cartridge 60 from being coming-off prevented by blocking opening portion 41a of insertion hole 41 by engaging portion 57 in a case where nozzle 20 does not exist, are provided. In addition, in the present embodiment, a configuration in which nozzle holder 19 includes only one clamp lever 50 having such a function, and nozzle 20 is locked and cartridge 60 is prevented from coming off only by one clamp lever 50, is achieved, and it has been realized to make nozzle holder 19 smaller and more compact.

In a state illustrated in FIG. 5, that is, in a state where nozzle 20 is inserted and held by holder tube portion 40, nozzle receiving portion 40b of holder tube portion 40 is positioned to be lower than the lower end portion 50a of clamp lever 50. Accordingly, the lower end part of holder tube portion 40 functions as a bumper for protecting clamp lever 50, and damage to the lower end portion of clamp lever 50 due to collision of nozzles or other foreign substances can be prevented.

In the present embodiment, similar to the configuration, in a configuration in which clamp lever 50 is held by the elastic members, such as fulcrum spring 58 or clamp spring 59, defects, such as deviation of the fulcrum due to the application of an unexpected external force and dropping of clamp lever 50 can be prevented. In addition, nozzle receiving portion 40b of holder tube portion 40 serves as a nozzle receiving member which abuts against flange portion 20b of nozzle 20 installed on nozzle holder 19, and it is possible to prevent rattling of nozzle 20 installed on nozzle holder 19.

At the outer circumference of clamp spring holding unit 47 of holder tube portion 40 and working unit side groove 55 of clamp lever 50, clamp spring 59 which is spirally wound to circulate around clamp spring holding unit 47 and working unit side groove 55, and uses a compression coil spring, is installed. Clamp spring 59 is a first elastic member that biases engaging portion 57 of fulcrum portion 51 to installed portion 20c inserted into insertion hole 41. At this time, clamp spring 59 sets clamp spring 59 to be wound to circulate around working unit side groove 55 of clamp lever 50 and clamp spring holding unit 47 of holder tube portion 40. In this state, as illustrated in FIG. 5, an aspect in which a part of clamp lever 50 and holder tube portion 40 is inserted into inner diameter space 59a of clamp spring 59 is achieved, and clamp spring 59 is installed on nozzle holder 19 in a state of coming into contact with clamp lever 50 and holder tube portion 40.

In an aspect in which clamp lever 50 is held by clamp spring 59 in holder tube portion 40 in this manner, in the present embodiment, since working unit side groove 55 is set to be narrower than clamp spring holding unit 47, clamp spring 59 is more substantially compressed in the vertical direction than the other part, that is, clamp spring holding unit 47 side of holder tube portion 40, by working unit side groove 55 on clamp lever 50 side. In other words, a part of clamp spring 59 which comes into contact with clamp lever 50 is more compressed than the other part, by clamp lever 50. Accordingly, in clamp spring 59 which uses the compression coil spring having a configuration of winding a plurality of coil rings, a plurality of coil rings 59* positioned on the lower side are wound in a state of being inclined between slopes between clamp spring holding unit 47 and working unit side groove 55.

Accordingly, a tension (arrow g) that does not occur in a usual state of use of the compression coil spring acts on coil rings 59* in the inclined state. In addition, by the tension, an engaging force acts on fulcrum portion 51 provided with working unit side groove 55 in the inward direction of holder tube portion 40, that is, in the direction of pressing engaging portion 57 to installed portion 20c installed on insertion hole 41. Accordingly, by a compact configuration using small clamp spring 59, it is possible to apply a sufficiently large force in the closing direction to clamp lever 50, and it is possible to stably lock installed portion 20c.

As illustrated in FIG. 8, vent hole 40a for introducing a negative pressure into insertion hole 41 is provided in the upper end portion of insertion hole 41 provided in holder tube portion 40, and vent hole 40a is connected to negative pressure generation source 33 via rotating body inner hole 35c illustrated in FIG. 3. In other words, vent hole 40a configures a second suction path linked to negative pressure generation source 33 and in nozzle holder 19 having the above-described configuration, installed portion 20c of nozzle 20 is inserted into insertion hole 41 formed in to communicate with a terminal of the second suction path, and nozzle 20 is held to be freely attachable and detachable. In addition, insertion hole 41 has a function of inserting and storing cartridge 60 having filter 62 for filtering the air suctioned from nozzle 20.

In addition, the lower side of insertion hole 41 is open entrance 41b, and is an entrance when inserting cartridge 60 (refer to FIG. 6) stored in nozzle holder 19 or installed portion 20c of nozzle 20 thereinto. Furthermore, in a far portion of insertion hole 41, the upper end portion of cartridge 60 inserted into insertion hole 41 abuts, and stopper 41c which is a position regulating surface for regulating the position, is provided.

Next, with reference to FIGS. 6, 9, and 10, cartridge 60 which is used in electronic component installing device 1 provided with nozzle holder 19 having the above-described configuration, and is installed on nozzle holder 19 in a state of being inserted into holder tube portion 40, and an attaching and detaching structure of cartridge 60 will be described.

Figure 6:
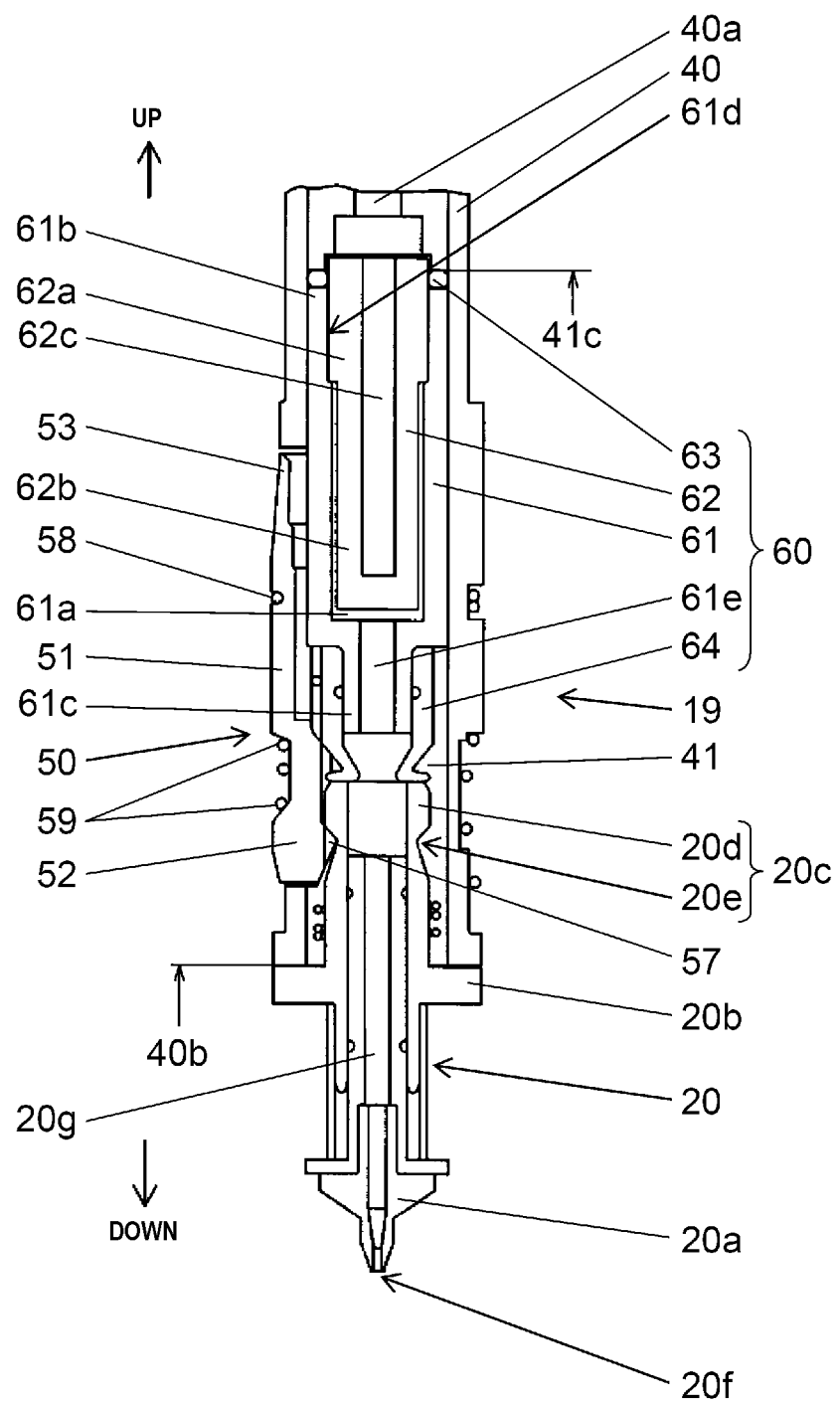
FIG. 6 is a sectional view of the nozzle holder in the main shaft used in the electronic component installing device according to the embodiment of the present disclosure.

FIG. 6 illustrates a state where cartridge 60 is stored in nozzle holder 19, and further, nozzle 20 is held by nozzle holder 19. First, a configuration of cartridge 60 will be described. Cartridge 60 is configured to include tubular filter holding body 61 which is inserted into insertion hole 41; filter 62 which is disposed in inner space 61a of filter holding body 61; annular packing 63 which is disposed at one end portion 61b of filter holding body 61; vent hole 61e which is provided on the inside of the other end portion 61c of filter holding body 61; and pad 64 which is disposed in the other end portion 61c.

Filter holding body 61 has an outer dimension that can be inserted into insertion hole 41 formed in holder tube portion 40, and has inner space 61a which penetrates from one end portion 61b to the other end portion 61c. Filter 62 is disposed in inner space 61a and has a function of filtering the air suctioned from nozzle flow path 20g which is the first suction path. Packing 63 abuts against stopper 41c provided at the far portion of insertion hole 41, and accordingly, vent hole 40a which is the second suction path and inner space 61a are airtightly connected to each other. Pad 64 abuts against large diameter portion 20d of installed portion 20c inserted into insertion hole 41, and accordingly, nozzle flow path 20g and inner space 61a are airtightly connected to each other.

Only by inserting filter 62, packing 63, and cartridge 60 integrated with pad 64 into insertion hole 41 in this manner, it is possible to easily attach and detach cartridge 60 to and from nozzle holder 19, and the workability of the filter attachment and detachment work has been substantially improved. Furthermore, by interposing packing 63 and pad 64 simply above and below cartridge 60, not only the airtightness is secured, but also the effect of relaxing the shock when attaching and detaching nozzle 20 is achieved.

Here, a structure of filter 62 installed on inner space 61a in filter holding body 61 will be described. Filter 62 is configured to include base portion 62a which comes into contact with inner wall 61d on inner space 61a side of filter holding body 61, filtering unit 62b which protrudes from base portion 62a toward the other end portion 61c side of filter holding body 61 in a state where there is a gap between inner wall 61d and filtering unit 62b, and a recess portion 62c which is open to base portion 62a.

By employing an installation structure of filter 62 on filter holding body 61 by such a simple method, a special structure for fixing filter 62 to filter holding body 61 is not required, and a cartridge having a small and simple configuration is realized. In addition, by making the sectional shape of filtering unit 62b be U shape, and by making filtering unit 62b be non-contact with inner wall 61d of filter holding body 61, it is possible to ensure a large filtration area with a size having a small diameter, and it is possible to reduce the size of filter 62 and to improve filtration performance at the same time.

In addition, in a state where filter 62 is installed on filter holding body 61, an aspect in which base portion 62a protrudes from inner space 61a of filter holding body 61, and packing 63 is held in the protrusion portion thereof, is achieved. Accordingly, it is not necessary to provide a special structure for fixing packing 63 to filter holding body 61, and packing 63 can be installed only by simply holding annular packing 63 at the outer circumference of cylindrical base portion 62a.

Figure 9:
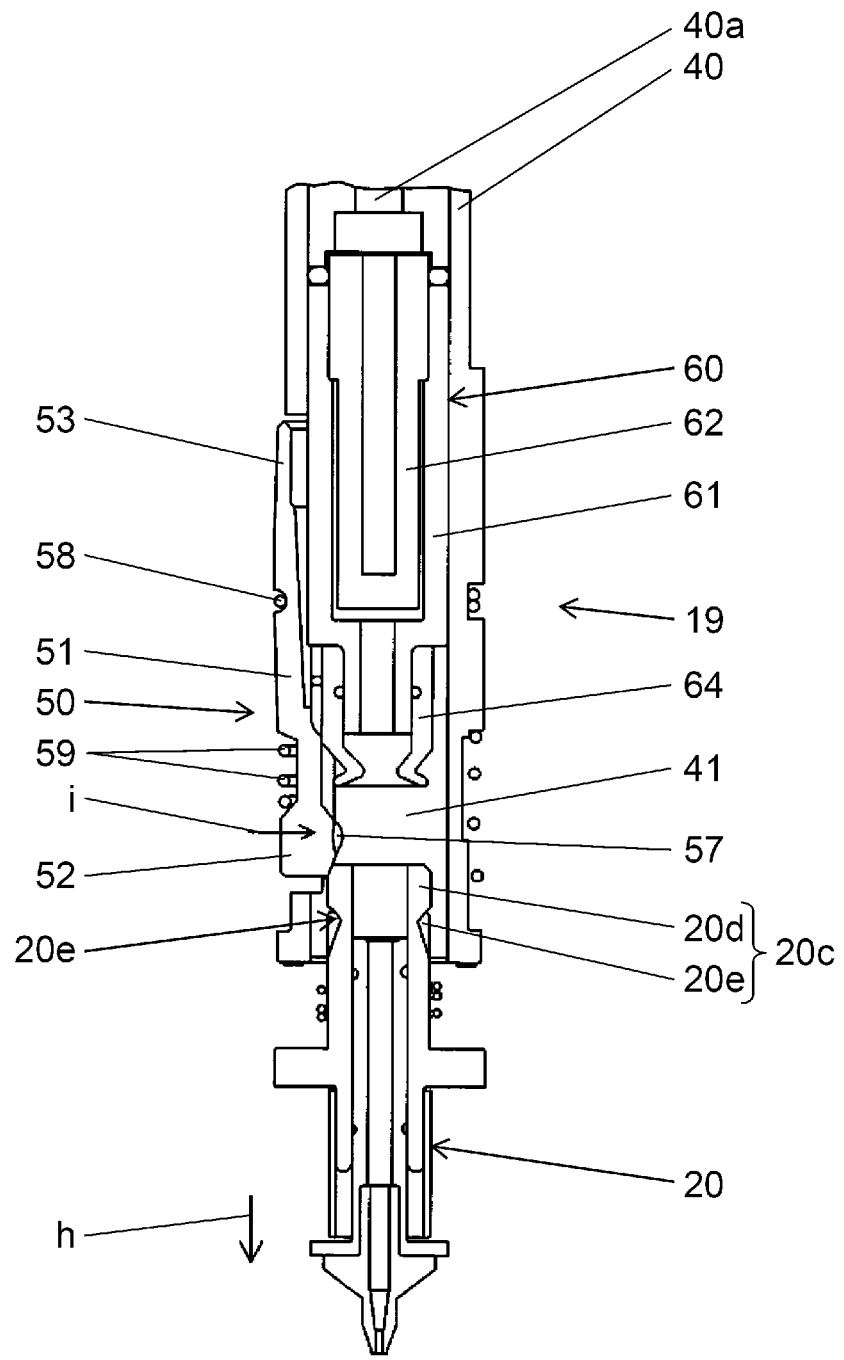
FIG. 9 is a sectional view of the nozzle holder in the main shaft used in the electronic component installing device according to the embodiment of the present disclosure.

FIG. 9 illustrates a state where nozzle 20 is detached from the state illustrated in FIG. 6. Detachment of nozzle 20 is performed by applying a force to nozzle 20 by a manual operation or a nozzle changer in a drawing direction (arrow h). In other words, due to the withdrawing force, engaging portion 57 of working unit 52 is released from engaged portion 20e against biasing force of clamp spring 59, and accordingly, the locking of installed portion 20c is released and nozzle 20 can be detached from nozzle holder 19. In addition, when holding nozzle 20 in nozzle holder 19, an operation of inserting and pushing installed portion 20c into insertion hole 41 is performed. Accordingly, engaging portion 57 of working unit 52 is engaged with engaged portion 20e, and installed portion 20c is locked.

When nozzle 20 is detached from nozzle holder 19 in this manner, a locking target does not exist at the position which corresponds to fulcrum portion 51 in insertion hole 41 on the inside of holder tube portion 40. In the present embodiment, since clamp lever 50 can swing around abutting fulcrum 56 of fulcrum portion 51, working unit 52 of clamp lever 50 is displaced to insertion hole 41 side by the biasing force of fulcrum spring 58 (arrow i). In addition, engaging portion 57 of displaced working unit 52 advances into insertion hole 41 to achieve a state where entrance 41b is blocked, and prevents stored cartridge 60 from coming off and dropping. With such a configuration, clamp lever 50 can also serve to prevent cartridge 60 from coming off, and it is possible to reduce to the size of nozzle holder 19.

Figure 10:
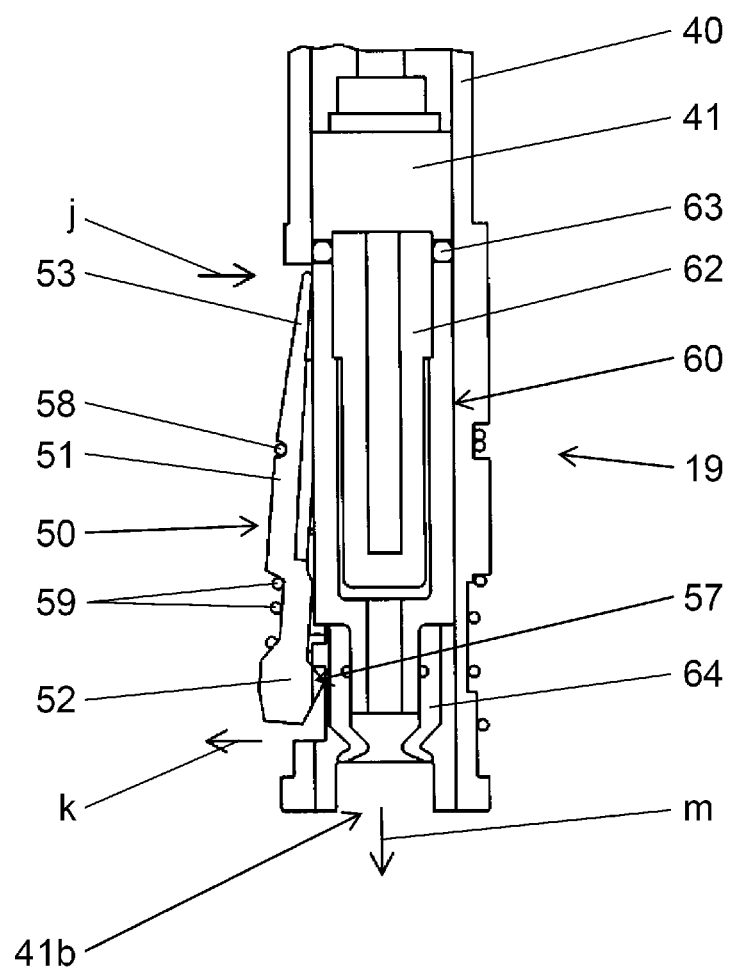
FIG. 10 is a sectional view illustrating a state where a cartridge in the nozzle holder used in the electronic component installing device according to the embodiment of the present disclosure, is detached.

FIG. 10 illustrates a state where cartridge 60 is attached and detached to and from nozzle holder 19 in a state where nozzle 20 is detached from nozzle holder 19. In this case, operation unit 53 side of clamp lever 50 is displaced to inner side of holder tube portion 40 by a manual operation (arrow j). Accordingly, clamp lever 50 swings only by a predetermined rotation amount around abutting fulcrum 56 (refer to FIG. 4) of fulcrum portion 51, and working unit 52 is displaced in the direction to open outward (arrow k). Accordingly, engaging portion 57 of working unit 52 is retracted from insertion hole 41, and cartridge 60 can go in and out (arrow m) of insertion hole 41 via entrance 41b.

As the operation illustrated in FIGS. 9 and 10 becomes possible, even in a state where only cartridge 60 is stored in nozzle holder 19 during automatic replacement of nozzle 20, cartridge 60 is prevented from falling off. In addition, when necessary, cartridge 60 can be picked up or exchanged from insertion hole 41 of nozzle holder 19 only by operating clamp lever 50. In the present embodiment, since cartridge 60 has a simple configuration for holding filter 62 on the inside of tubular filter holding body 61, cartridge 60 can easily go in and out of insertion hole 41 of nozzle holder 19.

Figure 11:
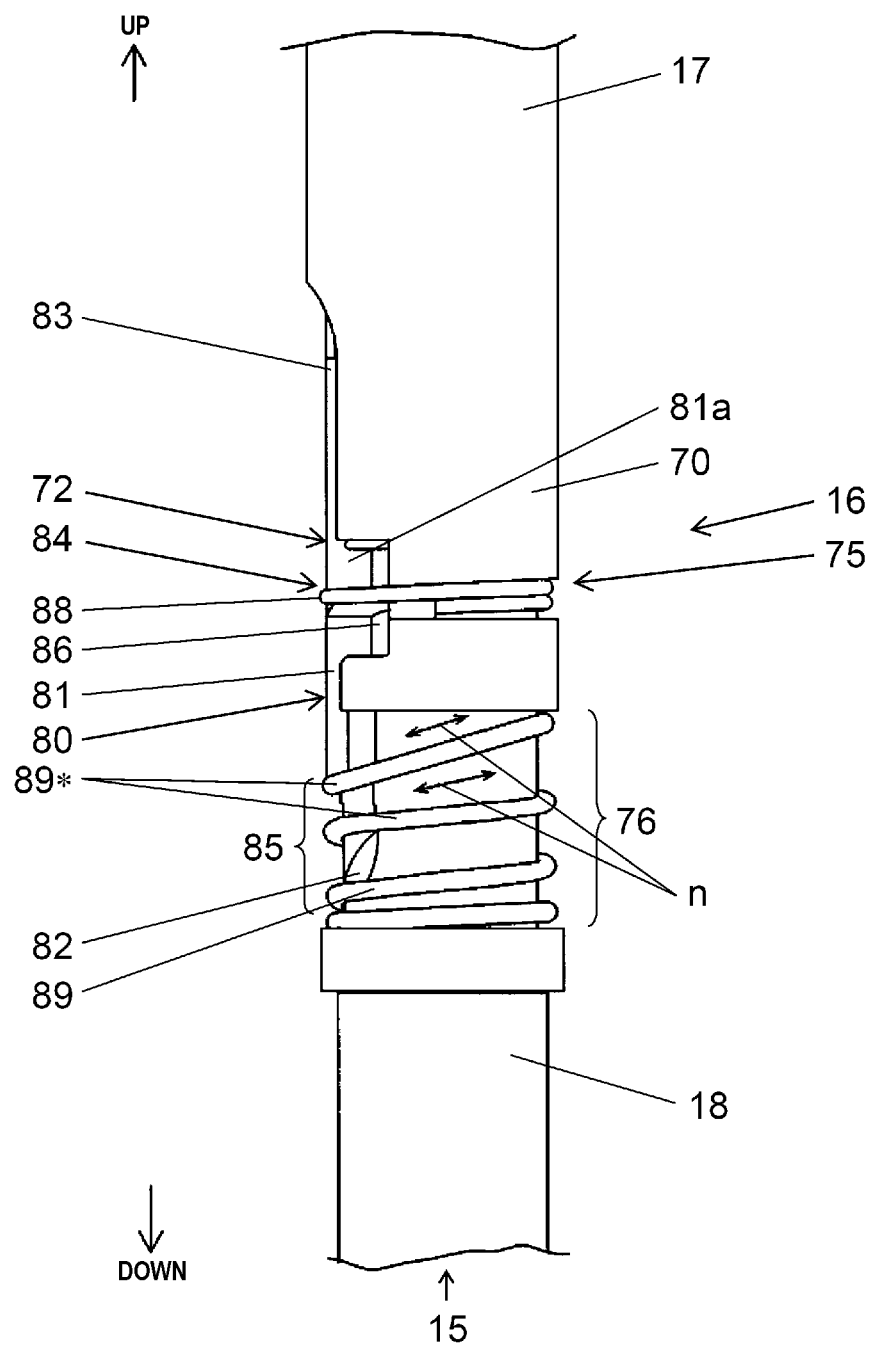
FIG. 11 is a partial side view of a shaft linking unit of the main shaft used in the electronic component installing device according to the embodiment of the present disclosure.

Next, with reference to FIGS. 11 to 14, a linking structure between first shaft 17 and second shaft 18 which configure main shaft 15 will be described. FIG. 11 illustrates a state where insertion end portion 18c (refer to FIG. 12) provided in the upper end portion of first shaft 17 is inserted into shaft linking unit 16 provided in the lower end portion of first shaft 17, and second shaft 18 is held in shaft linking unit 16.

Figure 12:
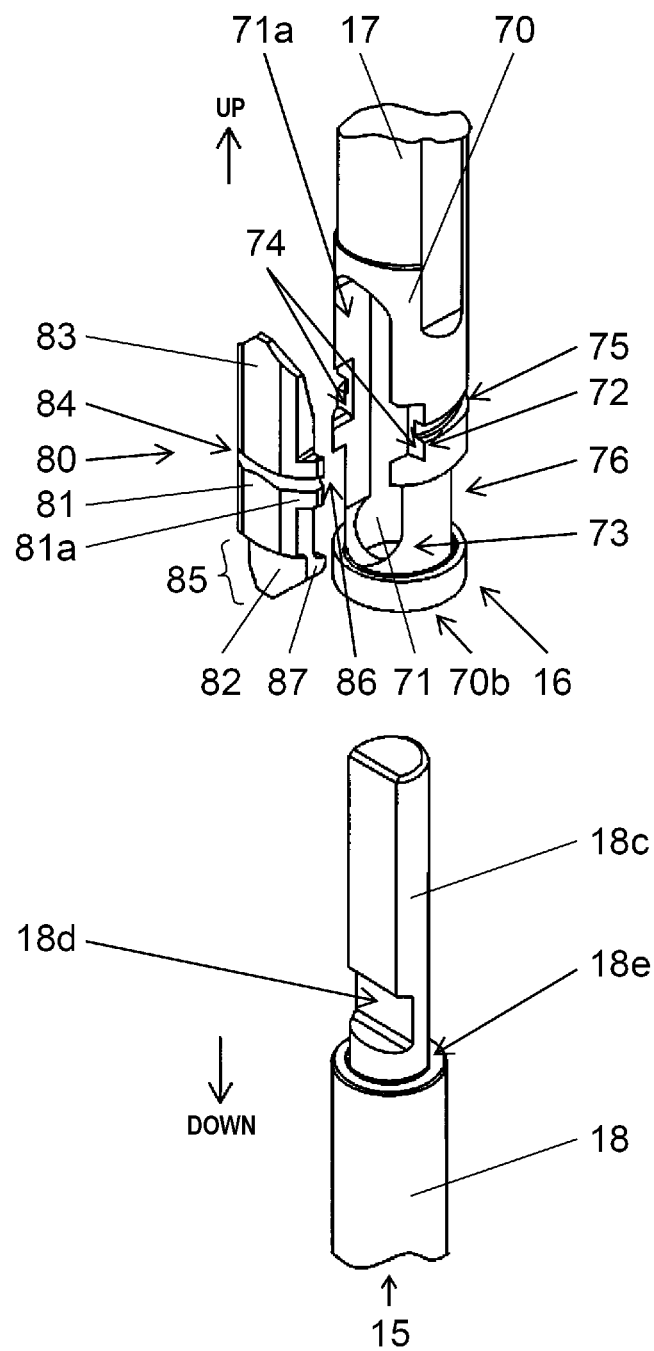
FIG. 12 is a partial perspective view illustrating a configuration of the shaft linking unit of the main shaft used in the electronic component installing device according to the embodiment of the present disclosure.

As illustrated in FIG. 12, in a predetermined range of the upper end of second shaft 18, insertion end portion 18c having a shape of which one surface is D-cut is provided. Groove portion 18d is linearly formed in a lower portion of insertion end portion 18c in the direction orthogonal to the axial direction of main shaft 15. Shaft linking unit 16 provided in the lower end portion of first shaft 17 is configured to include shaft holder tube portion 70, shaft clamp lever 80, and clamp spring 89 (FIG. 11). Clamp spring 89 has a function as an elastic member which biases shaft clamp lever 80 to groove portion 18d of insertion end portion 18c installed on shaft holder tube portion 70.

Shaft holder tube portion 70 has a tubular shape having shaft insertion hole 71 into which insertion end portion 18c of second shaft 18 is inserted, and shaft holder opening portion 71a leading to shaft insertion hole 71 is formed on one side surface thereof. On the side surface of the substantial center portion of shaft holder opening portion 71a in shaft holder tube portion 70, notch portion 72 having a shape in which a tube portion of shaft holder tube portion 70 is partially cut off by a surface parallel to shaft holder opening portion 71a, is formed. Furthermore, at a position at which notch portion 72 is formed, fulcrum spring holding unit 75 is formed.

One shaft clamp lever 80 having the shape illustrated in FIG. 12 is fitted to shaft holder opening portion 71a, shaft clamp lever 80 has a function for locking insertion end portion 18c inserted into shaft insertion hole 71 with shaft clamp lever engaging portion 87 provided in shaft clamp lever working unit 82 which will be described hereinafter. In other words, in the present embodiment, shaft clamp lever engaging portion 87 of one shaft clamp lever 80 is engaged with groove portion 18d of insertion end portion 18c inserted into shaft insertion hole 71 via shaft holder opening portion 71a. By employing a configuration in which insertion end portion 18c is locked by single shaft clamp lever 80 as described above, the reduction of the size of nozzle holder 19 is realized, second shaft 18 can be linked and detached from first shaft 17 only by operating one shaft clamp lever 80, and thus, the operability at the time of operation is improved.

The detailed shape and the function of shaft clamp lever 80 will be described. The center portion of shaft clamp lever 80 is shaft clamp lever fulcrum portion 81. In shaft clamp lever fulcrum portion 81, extending portion 81a having a shape that can be fitted to notch portion 72 is provided to extend to both sides, and abutting fulcrum 86 which abuts against shaft holder fulcrum support unit 74 on the lower surface of extending portion 81a and becomes the center when shaft clamp lever 80 swings is provided. The position that extends downward from shaft clamp lever fulcrum portion 81 is shaft clamp lever working unit 82. On the lower surface of shaft clamp lever working unit 82, shaft clamp lever engagement portion 87 having a shape that is engaged with groove portion 18d of insertion end portion 18c inserted into shaft insertion hole 71 is provided on the lower surface (also refer to FIG. 13). Furthermore, the position that extends upward from shaft clamp lever fulcrum portion 81 is shaft clamp lever operation unit 83.

In other words, as illustrated in the above-described configuration, shaft clamp lever 80 is configured to include shaft clamp lever fulcrum portion 81, shaft clamp lever working unit 82 which extends downward from shaft clamp lever fulcrum portion 81; and shaft clamp lever operation unit 83 which extends upward from shaft clamp lever fulcrum portion 81. In addition, as described above, notch portion 72 is formed on the side surface of shaft holder tube portion 70, and at least a part of shaft clamp lever 80 is configured to be disposed on the inside of notch portion 72. In this manner, by disposing a part of shaft clamp lever 80 in the notch portion formed in shaft holder tube portion 70, the size of the outer shape of shaft linking unit 16 can be reduced.

Fulcrum portion side groove 84 having a shape of a narrow groove is provided in shaft clamp lever fulcrum portion 81, and working unit side groove 85 having a shape of a wide groove is provided in shaft clamp lever working unit 82. As illustrated in FIG. 11, when installing shaft holder tube portion 70 on shaft clamp lever 80, first, extending portion 81a is fitted to notch portion 72.

At this time, abutting fulcrum 86 provided on the lower surface of extending portion 81a abuts against shaft holder fulcrum support unit 74 (refer to FIG. 12) which is a notch surface of notch portion 72. In other words, in shaft holder tube portion 70, shaft holder fulcrum supporting unit 74 for supporting abutting fulcrum 86 is provided in notch portion 72. In this manner, by using notch portion 72 provided in shaft holder tube portion 70 as shaft holder fulcrum supporting unit 74 for supporting shaft clamp lever 80, it is possible to reduce the size of the outer shape of shaft linking unit 16.

At the outer circumference of fulcrum portion side groove 84 and fulcrum spring holding unit 75, shaft clamp lever fulcrum spring 88 using a coil spring which is spirally wound to circulate around fulcrum portion side groove 84 and fulcrum spring holding unit 75 is installed. Shaft clamp lever fulcrum spring 88 has a function for biasing abutting fulcrum 86 of shaft clamp lever fulcrum portion 81 of shaft clamp lever 80 to shaft holder fulcrum support unit 74. Accordingly, shaft clamp lever 80 is held in a state where abutting fulcrum 86 of shaft clamp lever fulcrum portion 81 abuts against shaft holder fulcrum support unit 74, and is placed in a state of being swingable around abutting fulcrum 86 by shaft holder fulcrum support unit 74.

With such a configuration, as shaft clamp lever 80 swings around abutting fulcrum 86 of shaft clamp lever fulcrum portion 81, the following functions are realized. In other words, by displacing shaft clamp lever working unit 82 side toward the inside of shaft holder tube portion 70, a structure in which shaft clamp lever engaging portion 87 formed in shaft clamp lever working unit 82 is advanced into shaft insertion hole 71 on the inside of shaft holder tube portion 70, is achieved. On the other hand, when shaft clamp lever operation unit 83 side is displaced toward the inner side of shaft holder tube portion 70, the shaft clamp lever working unit 82 opens outward, the locking of insertion end portion 18c inserted into shaft insertion hole 71 of shaft holder tube portion 70 is released, and it is possible to release the linking between first shaft 17 and second shaft 18 by shaft linking unit 16.

At the outer circumference of clamp spring holding unit 47 of shaft holder tube portion 70 and working unit side groove 85 of shaft clamp lever 80, clamp spring 89 which is spirally wound to circulate around clamp spring holding unit 47 and working unit side groove 85, and uses a compression coil spring, is installed. Clamp spring 89 is an elastic member that biases shaft clamp lever engaging portion 87 of shaft clamp lever working unit 82 to groove portion 18d of insertion end portion 18c inserted into shaft insertion hole 71. At this time, clamp spring 89 sets clamp spring 89 so as to be wound to circulate around working unit side groove 85 of shaft clamp lever 80 and clamp spring holding unit 76 of shaft holder tube portion 70. In this state, as illustrated in FIG. 13, an aspect in which a part of shaft clamp lever 80 and shaft holder tube portion 70 is inserted into inner diameter space 89a of clamp spring 89 is achieved, and clamp spring 89 is installed on shaft linking unit 16 in a state of coming into contact with shaft clamp lever 80 and shaft holder tube portion 70.

In an aspect in which shaft clamp lever 80 is held by clamp spring 89 in shaft holder tube portion 70 in this manner, in the present embodiment, since working unit side groove 85 is set to be narrower than clamp spring holding unit 76, clamp spring 89 is more substantially compressed in the vertical direction than the other part, that is, clamp spring holding unit 76 side of shaft holder tube portion 70, by working unit side groove 85 on shaft clamp lever 80 side. In other words, a part of clamp spring 89 which comes into contact with shaft clamp lever 80 is more compressed than the other part, by shaft clamp lever 80. Accordingly, in clamp spring 89 having a configuration in which a plurality of coil rings are wound, a plurality of coil rings 89* (refer to FIG. 11) positioned on the lower side are wound in a state of being inclined between working unit side groove 85 and clamp spring holding unit 76.

Accordingly, a tension (arrow n) that does not occur in a usual state of use of the compression coil spring acts on coil rings 89* in the inclined state. In addition, with the tension, the locking force acts on shaft clamp lever working unit 82 provided with the working unit side groove 85 in the inward direction of shaft holder tube portion 70, that is, in the direction of pushing shaft clamp lever engaging portion 87 with respect to groove portion 18d of insertion end portion 18c inserted into shaft insertion hole 71. Accordingly, by a compact configuration using small clamp spring 89, it is possible to apply a sufficiently large force in the closing direction to shaft clamp lever 80, and it is possible to stably lock groove portion 18d of insertion end portion 18c and to prevent defects, such as occurrence of vibrations in shaft linking unit 16.

Figure 13:
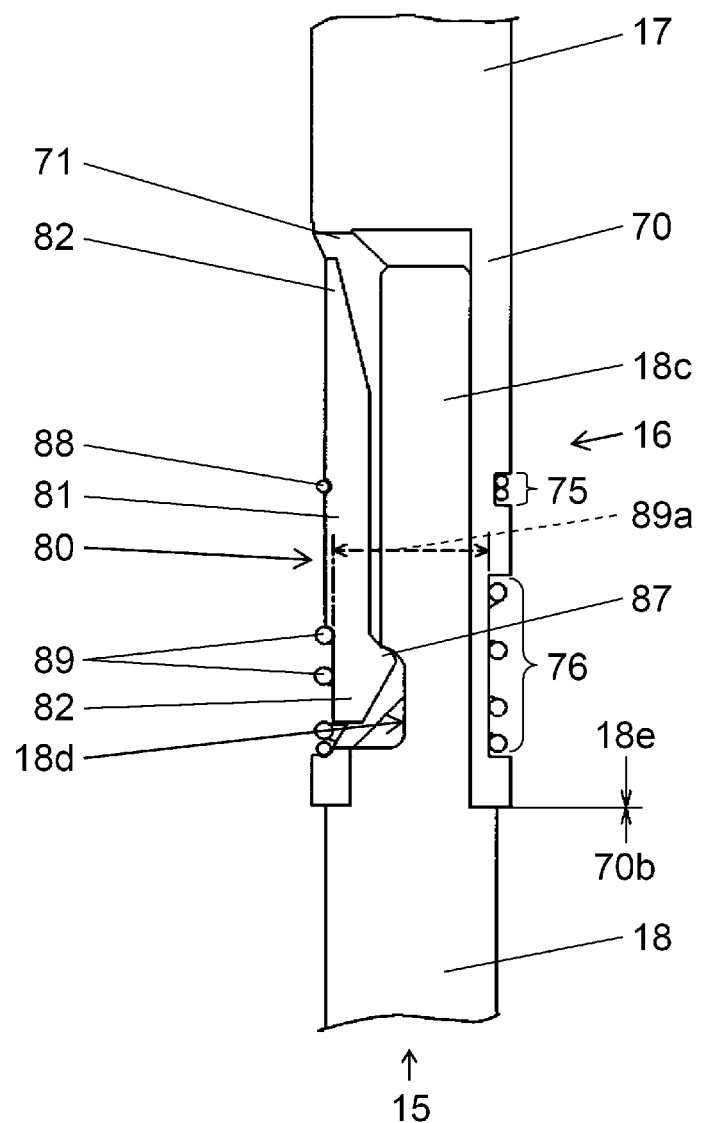
FIG. 13 is a partial sectional view of a shaft linking unit of the main shaft used in the electronic component installing device according to the embodiment of the present disclosure.

FIG. 13 illustrates a state where first shaft 17 and second shaft 18 are linked to each other via shaft linking unit 16 having the above-described configuration provided on first shaft 17. In other words, insertion end portion 18c of second shaft 18 is inserted into shaft insertion hole 71 provided in shaft holder tube portion 70 from below, and abutting portion 18e (also refer to FIG. 12) of second shaft 18 is pressed until abutting against receiving end portion 70b of shaft holder tube portion 70. In the operation, first, shaft clamp lever working unit 82 is pushed out against the biasing force of clamp spring 89 by the end portion of insertion end portion 18c. Next, groove portion 18d provided in insertion end portion 18c reaches the position of shaft clamp lever engaging portion 87, and accordingly, shaft clamp lever engaging portion 87 is engaged with groove portion 18d and is locked by the biasing force of clamp spring 89.

Figure 14:
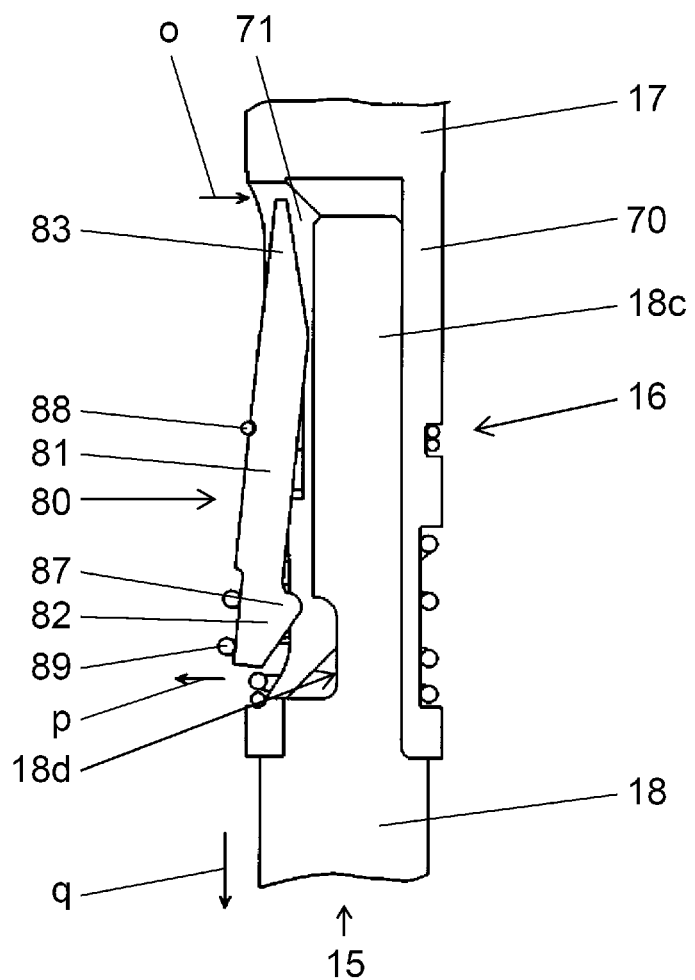
FIG. 14 is a functional explanatory view of a shaft linking unit of the main shaft used in the electronic component installing device according to the embodiment of the present disclosure.

FIG. 14 illustrates an operation for detaching second shaft 18 from the linked state illustrated in FIG. 13. In other words, in the detaching operation, first, shaft clamp lever operation unit 83 of shaft clamp lever 80 is pressed by a finger or the like, and is pushed into shaft insertion hole 71 (arrow o). By this operation, shaft clamp lever 80 swings around abutting fulcrum 86 (FIG. 12) of shaft clamp lever fulcrum portion 81, and shaft clamp lever working unit 82 is displaced in the direction to open outward against the biasing force of clamp spring 89 (arrow p). Accordingly, the engaged state of shaft clamp lever engaging portion 87 with groove portion 18d is released, and the operation of pulling out insertion end portion 18c from shaft insertion hole 71 (arrow q) becomes possible.

In the detaching operation, it is possible to pick up second shaft 18 only with a simple pressing operation targeting one shaft clamp lever 80. In addition, in main shaft 15, since there is no component or the like which interferes with the work between shaft linking unit 16 and main shaft holding unit 12 (refer to FIG. 2) positioned at the lower part in first shaft 17, it is possible to perform an operation of taking first shaft 17 and second shaft 18 in and out with excellent workability.

As described above, in the electronic component installing device according to the present embodiment, nozzle holder 19 which attachably and detachably holds nozzle 20 in the lower end portion of main shaft 15 is configured to have a shape of a tube having insertion hole 41 into which installed portion 20c of nozzle 20 is inserted, and to include holder tube portion 40 in which opening portion 41a leading to insertion hole 41 is formed on one side surface of nozzle holder 19, clamp lever 50 including engaging portion 57 that is engaged with installed portion 20c of nozzle 20 inserted into insertion hole 41 via opening portion 41a, and clamp spring 59 which is biased to installed portion 20c of nozzle 20 in which engaging portion 57 is inserted into insertion hole 41. Accordingly, in the configuration in which nozzle 20 which holds the electronic component under a negative pressure is held to be freely attachable and detachable to and from nozzle holder 19, it is possible to realize the reduction of the size of nozzle 20 and nozzle holder 19.

In addition, in the electronic component installing device illustrated in the present embodiment, in a configuration in which cartridge 60 including filter 62 for filtering the air suctioned from nozzle 20 is stored in nozzle holder 19, nozzle holder 19 includes insertion hole 41 for inserting and storing cartridge 60 from entrance 41b thereof, tubular holder tube portion 40 having vent hole 40a for introducing a negative pressure into insertion hole 41, and clamp lever 50 in which engaging portion 57 engaged with installed portion 20c of nozzle 20 installed into insertion hole 41 in a state where entrance 41b of insertion hole 41 is blocked, is formed, and when nozzle 20 is detached from nozzle holder 19, clamp lever 50 prevents cartridge 60 in insertion hole 41 from coming off being displaced to insertion hole 41 side. Accordingly, in the configuration in which cartridge 60 which holds nozzle 20 for holding the electronic component under a negative pressure to be freely attachable and detachable in nozzle holder 19, and which includes filter 62 for filtering the air suctioned from nozzle 20, is provided, it is possible to reduce the size of nozzle holder 19, and to easily store and pick up cartridge 60 to and from nozzle holder 19.

In addition, in the cartridge for the electronic component installing device according to the present embodiment, cartridge 60 stored in nozzle holder 19 is configured to include: filter holding body 61 which has an external dimension that is insertable into insertion hole 41, and has inner space 61a that penetrates from one end portion 61b to the other end portion 61c; filter 62 which is disposed in inner space 61a, and filters the air suctioned from nozzle flow path 20g that serves as the first suction path; annular packing 63 which is disposed in one end portion 61b of filter holding body 61, and abuts against stopper 41c provided in a far portion of insertion hole 41 so as to airtightly connect vent hole 40a that serves as a second suction path and inner space 61a to each other; and pad 64 which is disposed in the other end portion 61c of filter holding body 61, and is made of an elastic material which abuts against installed portion 20c inserted into insertion hole 41 so as to airtightly connect nozzle flow path 20g and inner space 61a to each other. Accordingly, in the configuration in which cartridge 60 including filter 62 for filtering the air suctioned from nozzle 20, is provided, it is possible to reduce the size of nozzle holder 19, to improve the filtration performance of filter 62, and to improve the workability at the time of attachment and detachment.

Furthermore, in the electronic component installing device according to the present embodiment, in the configuration in which main shaft 15 having nozzle holder 19 for attachably and detachably holding nozzle 20 in the lower end portion thereof is divided into first shaft 17 which is the main shaft upper portion linked to raising and lowering mechanism 25 and second shaft 18 which is the main shaft lower portion including a part held by nozzle holder 19 and main shaft holding unit 12, the configuration in which shaft linking unit 16 for inserting and holding insertion end portion 18c provided in second shaft 18 in the lower end portion of first shaft 17 is provided, groove portion 18d which is linearly formed in the direction orthogonal to the axial direction of main shaft 15 is provided in insertion end portion 18c of second shaft 18, shaft clamp lever 80 which is engaged with groove portion 18d in shaft linking unit 16 and clamp spring 89 that serves as an elastic member for biasing shaft clamp lever 80 to groove portion 18d are provided, is employed. Accordingly, in the configuration in which main shaft 15 including nozzle holder 19 which holds nozzle 20 is divided into two to be vertically attachable and detachable via shaft linking unit 16, it is possible to make the structure of shaft linking unit 16 small and simple, and to improve the workability during the attachment and detachment.

INDUSTRIAL APPLICABILITY

An electronic component installing device of the present disclosure has an effect that it is possible to reduce the size of a nozzle holder and to easily store and pick up a cartridge to and from the nozzle holder of the cartridge in a configuration in which the cartridge which holds the nozzle for holding the electronic component under a negative pressure to be freely attachable and detachable in the nozzle holder, and which includes a filter for filtering the air suctioned from the nozzle, and is useful in a component installing field where the electronic component is suctioned and held under a negative pressure by the nozzle.

REFERENCE MARKS IN THE DRAWINGS

1 ELECTRONIC COMPONENT INSTALLING DEVICE
8 INSTALLING HEAD
12 MAIN SHAFT HOLDING UNIT
15 MAIN SHAFT
16 SHAFT LINKING UNIT
17 FIRST SHAFT
18 SECOND SHAFT
19 NOZZLE HOLDER
20 NOZZLE
20a TIP END PORTION
20g NOZZLE FLOW PATH (FIRST SUCTION PATH)
20c INSTALLED PORTION
25 RAISING AND LOWERING MECHANISM
40 HOLDER TUBE PORTION
40a VENT HOLE (SECOND SUCTION PATH)
41 INSERTION HOLE
41a OPENING PORTION
41c STOPPER
45 FULCRUM SUPPORT UNIT
50 CLAMP LEVER
51 FULCRUM PORTION
52 WORKING UNIT
53 OPERATION UNIT
57 ENGAGING PORTION
58 FULCRUM SPRING
59, 89 CLAMP SPRING
60 CARTRIDGE
61 FILTER HOLDING BODY
62 FILTER
62a BASE PORTION
62b FILTERING UNIT
62c RECESS
63 PACKING
64 PAD
70 SHAFT HOLDER TUBE PORTION
71 SHAFT HOLDER INSERTION HOLE

80 SHAFT CLAMP LEVER
81 SHAFT CLAMP LEVER FULCRUM PORTION
82 SHAFT CLAMP LEVER WORKING UNIT
83 SHAFT CLAMP LEVER OPERATION UNIT
87 ENGAGING PORTION

The invention claimed is:

1. An electronic component installing device comprising:
a nozzle which holds an electronic component by applying a negative pressure to a suction hole that is open in a tip end portion of the nozzle;
a main shaft which includes a nozzle holder that detachably holds the nozzle in a lower end portion of the main shaft; and
a cartridge which includes a filter for filtering air suctioned from the nozzle,
wherein the nozzle holder includes
an insertion hole having an entrance from which the cartridge is inserted to be accommodated in the insertion hole
a tubular holder tube portion having a vent hole for introducing a negative pressure into the insertion hole, and
a clamp lever in which an engaging portion engaged with an engaged portion of the nozzle inserted into the insertion hole in a state where the entrance of the insertion hole is blocked, is formed, and
wherein, when the nozzle is detached from the nozzle holder, the clamp lever prevents the cartridge from coming off the insertion hole by being displaced toward the insertion hole.

2. The electronic component installing device of claim 1,
wherein the clamp lever includes a fulcrum portion, a working unit that extends downward from the fulcrum portion, and an operation unit that extends upward from the fulcrum portion,
wherein the clamp lever moves around the fulcrum portion to cause the engaging portion formed in the working unit to enter the holder tube portion, and
wherein, when the operation unit is displaced toward the inside of the holder tube portion, the working unit is open to the outside, and going in and out of the insertion hole of the cartridge becomes possible.

3. The electronic component installing device of claim 1,
wherein the cartridge further includes a tubular filter holding body, and
wherein the filter is held on inside of the filter holding body.

4. A cartridge for an electronic component installing device which is used in an electronic component installing device including: (i) a nozzle which has a tip end portion and an installed portion, the nozzle is provided with a first suction path which penetrates from the tip end portion to the installed portion, and the nozzle holds an electronic component in the tip end portion under a negative pressure introduced to the first suction path; and (ii) a nozzle holder which inserts the installed portion into an insertion hole provided to communicate with a second suction path connected to a negative pressure generation source, the nozzle holder detachably holding the nozzle, the cartridge being installed on the nozzle holder in a state of being inserted into the insertion hole, the cartridge comprising:
a filter holding body which has an external dimension that is insertable into the insertion hole, and has an inner space that penetrates from one end portion to the other end portion of the filter holding body;
a filter which is disposed in the inner space, and filters air suctioned through the first suction path;
an annular packing which is disposed in the one end portion of the filter holding body, and abuts against a stopper provided in a far portion of the insertion hole so as to airtightly connect the second suction path and the inner space to each other; and
a pad which is disposed in the other end portion of the filter holding body, and is made of an elastic material which abuts against the installed portion inserted into the insertion hole so as to airtightly connect the first suction path and the inner space to each other.

5. The cartridge for an electronic component installing device of claim 4,
wherein the filter further includes
a base portion in contact with a part of an inner wall of the filter holding body, the part of the inner wall being nearer to the one end portion of the filter holding body,
a filtering unit which protrudes from the base portion towards the other end portion of the filter holding body in a state of having a gap with the inner wall of the filter holding body, and
a recess portion which is open in the base portion.

6. The cartridge for an electronic component installing device of claim 5,
wherein the base portion of the filter has a protrusion portion which protrudes from the one end portion of the filter holding body, and the packing is held by the protrusion portion.

* * * * *